US009203367B2

(12) United States Patent
Disch

(10) Patent No.: US 9,203,367 B2
(45) Date of Patent: *Dec. 1, 2015

(54) APPARATUS AND METHOD FOR MODIFYING AN AUDIO SIGNAL USING HARMONIC LOCKING

(75) Inventor: Sascha Disch, Fuerth (DE)

(73) Assignee: Fraunhofer-Gesellschaft zur Foerderung der angewandten Forschung e.V., Munich (DE)

( * ) Notice: Subject to any disclaimer, the term of this patent is extended or adjusted under 35 U.S.C. 154(b) by 447 days.

This patent is subject to a terminal disclaimer.

(21) Appl. No.: 13/587,143

(22) Filed: Aug. 16, 2012

(65) Prior Publication Data

US 2013/0182862 A1 Jul. 18, 2013

Related U.S. Application Data

(63) Continuation of application No. PCT/EP2011/052834, filed on Feb. 25, 2011.

(60) Provisional application No. 61/308,513, filed on Feb. 26, 2010.

(30) Foreign Application Priority Data

Sep. 3, 2010 (EP) .................................... 10175282

(51) Int. Cl.
*B29C 45/00* (2006.01)
*H03G 3/00* (2006.01)
(Continued)

(52) U.S. Cl.
CPC . *H03G 3/00* (2013.01); *G10H 1/08* (2013.01); *G10H 1/20* (2013.01); *G10H 3/125* (2013.01);
(Continued)

(58) Field of Classification Search
CPC ........... G10H 1/08; G10H 1/20; G10H 3/125; G10H 2210/066; G10H 2250/031; G10H 1/12; G10H 1/00; G10H 3/12; G10H 1/0008; G10H 2220/116; G10H 1/06; G10H 7/10; G10L 21/00; G10L 2021/0135; G10L 25/18; G10L 25/90; G10L 19/02; G10L 21/003; G10L 21/007; G10L 21/04; G10L 19/0212; G10L 21/038; G10L 19/0204; G10L 19/20; G10L 19/16; G10L 19/18; G10L 19/008; H03G 3/00; H03G 5/00; G10G 3/04; G10G 1/04; H04S 1/002

USPC ........... 381/61, 119, 98, 71.14; 704/500, 200, 704/205, 233; 700/94; 84/609
See application file for complete search history.

(56) References Cited

U.S. PATENT DOCUMENTS 5,251,151 A * 10/1993 Demjanenko et al. .......... 702/56
6,825,775 B2 * 11/2004 Fling et al. ................. 340/856.3
(Continued)

FOREIGN PATENT DOCUMENTS

CN       1173007 A    2/1998
CN     101297356 A   10/2008
(Continued)

OTHER PUBLICATIONS

Official Communication issued in International Patent Application No. PCT/EP2011/052834, mailed on Jun. 29, 2011.
(Continued)

*Primary Examiner* — Vivian Chin
*Assistant Examiner* — Ubachukwu Odunukwe
(74) *Attorney, Agent, or Firm* — Keating & Bennett, LLP

(57) ABSTRACT

An apparatus for modifying an audio signal includes a filterbank processor, a fundamental determiner, an overtone determiner, a signal processor and a combiner. The filterbank processor generates a plurality of bandpass signals based on an audio signal and the fundamental determiner selects a bandpass signal of the plurality of bandpass signals to obtain a fundamental bandpass signal. The overtone determiner identifies a bandpass signal of the plurality of bandpass signals fulfilling an overtone criterion regarding the selected fundamental bandpass signal to obtain an overtone bandpass signal associated to the selected fundamental bandpass signal. The signal processor modifies the selected fundamental bandpass signal based on a predefined modification target. Additionally, the signal processor modifies an identified overtone bandpass signal associated to the selected fundamental bandpass signal depending on the modification of the selected fundamental bandpass signal. Further, the combiner combines the plurality of bandpass signals to obtain a modified audio signal.

13 Claims, 22 Drawing Sheets

(51) Int. Cl.
| | |
|---|---|
| *G10H 1/08* | (2006.01) |
| *G10H 1/20* | (2006.01) |
| *G10H 3/12* | (2006.01) |
| *G10L 21/00* | (2013.01) |
| *H03G 5/00* | (2006.01) |
| *G10L 25/18* | (2013.01) |
| *G10L 25/90* | (2013.01) |
| *G10L 21/013* | (2013.01) |

(52) U.S. Cl.
CPC ........ *G10L 21/00* (2013.01); *H03G 5/00* (2013.01); *G10H 2210/066* (2013.01); *G10H 2250/031* (2013.01); *G10L 25/18* (2013.01); *G10L 25/90* (2013.01); *G10L 2021/0135* (2013.01)

(56) References Cited

U.S. PATENT DOCUMENTS

| | | | |
|---|---|---|---|
| 7,230,177 | B2 | 6/2007 | Kawashima |
| 7,567,900 | B2* | 7/2009 | Suzuki et al. ............... 704/233 |
| 7,872,962 | B1* | 1/2011 | Nabar et al. ................ 370/206 |
| 8,036,394 | B1* | 10/2011 | Yonemoto et al. ............ 381/61 |
| 8,085,943 | B2* | 12/2011 | Bizjak ........................ 381/71.14 |
| 8,285,385 | B2* | 10/2012 | Schleich ...................... 607/57 |
| 8,392,198 | B1* | 3/2013 | Berisha et al. .............. 704/500 |
| 8,842,853 | B2* | 9/2014 | Vandali et al. ............... 381/98 |
| 2003/0187663 | A1 | 10/2003 | Truman et al. |
| 2004/0069120 | A1 | 4/2004 | Muraki |
| 2004/0078194 | A1 | 4/2004 | Liljeryd et al. |
| 2005/0096879 | A1* | 5/2005 | Waite et al. .................. 702/189 |
| 2005/0190199 | A1* | 9/2005 | Brown et al. ................ 345/600 |
| 2007/0100610 | A1* | 5/2007 | Disch et al. ................. 704/212 |
| 2008/0091417 | A1 | 4/2008 | Endo et al. |
| 2009/0095145 | A1* | 4/2009 | Streich et al. ................ 84/609 |
| 2009/0131119 | A1 | 5/2009 | Chang et al. |
| 2009/0241758 | A1* | 10/2009 | Neubacker ................... 84/609 |
| 2009/0271204 | A1 | 10/2009 | Tammi |
| 2009/0299755 | A1 | 12/2009 | Ragot et al. |
| 2011/0099018 | A1* | 4/2011 | Neuendorf et al. ........... 704/500 |
| 2011/0106529 | A1* | 5/2011 | Disch ........................... 704/205 |
| 2011/0106543 | A1* | 5/2011 | Jaillet et al. ................. 704/500 |
| 2011/0112670 | A1* | 5/2011 | Disch et al. ................... 700/94 |
| 2011/0125491 | A1* | 5/2011 | Alves et al. ................. 704/207 |
| 2011/0142258 | A1* | 6/2011 | Beer ............................. 381/98 |
| 2011/0173006 | A1* | 7/2011 | Nagel et al. ................. 704/500 |
| 2011/0270616 | A1* | 11/2011 | Garudadri et al. .......... 704/500 |
| 2012/0010880 | A1* | 1/2012 | Nagel et al. ................. 704/205 |
| 2012/0063616 | A1* | 3/2012 | Walsh et al. ................. 381/103 |
| 2012/0106746 | A1* | 5/2012 | Bonada et al. ............... 381/56 |
| 2013/0010985 | A1* | 1/2013 | Disch et al. ................. 381/119 |
| 2013/0023955 | A1* | 1/2013 | Schleich ...................... 607/57 |
| 2013/0090933 | A1* | 4/2013 | Villemoes et al. ........... 704/500 |
| 2013/0104726 | A1* | 5/2013 | Fukuda ........................ 84/622 |
| 2013/0144615 | A1* | 6/2013 | Rauhala et al. .............. 704/225 |
| 2013/0343573 | A1* | 12/2013 | Yang et al. .................. 381/103 |

FOREIGN PATENT DOCUMENTS

| | | |
|---|---|---|
| EP | 1 125 272 B1 | 12/2002 |
| EP | 2 099 024 A1 | 9/2009 |
| EP | 2 104 096 A2 | 9/2009 |
| JP | 04-136992 A | 5/1992 |
| JP | 06-202627 A | 7/1994 |
| JP | 07-219597 A | 8/1995 |
| JP | 2002-189472 A | 7/2002 |
| JP | 2004-021027 A | 1/2004 |
| JP | 2008-026565 A | 2/2008 |
| TW | 502248 A | 9/2002 |
| TW | 556149 A | 10/2003 |
| TW | I251807 A | 3/2006 |
| TW | 200939732 A | 9/2009 |
| WO | 02/17678 A1 | 2/2002 |
| WO | 2006/108543 A1 | 10/2006 |
| WO | 2007/052088 A1 | 5/2007 |

OTHER PUBLICATIONS

Disch et al., "An Amplitude- and Frequency-Modulation Vocoder for Audio Signal Processing," Proc. of 11th Int. Conference on Digital Audio Effects (DAFx-08), Sep. 1-4, 2008, pp. DAFX-1 to DAFX-7.
Disch et al., "Multiband Perceptual Modulation Analysis, Processing and Synthesis of Audio Signals," Proc. IEEE-ICASSP, 2009, pp. 2305-2308.
Disch et al., "An Iterative Segmentation Algorithm for Audio Signal Spectra Depending on Estimated Local Centers of Gravity," Proc. of the 12th Int. Conference on Digital Audio Effects (DAFx-09), Sep. 1-4, 2009, pp. DAFX-1 to DAFX-6.
Moore et al., "A Revision of Zwicker's Loudness Model," Acta Acustica, vol. 82, 1996, pp. 335-345.
Laroche et al., "Improved Phase Vocoder Time-Scale Modification of Audio," IEEE Transactions on Speech and Audio Processing, vol. 7, No. 3, May 1999, pp. 323-332.
Duxbury et al., "Improved Time-Scaling of Musical Audio Using Phase Locking at Transients," Audio Engineering Society, Convention Paper 5530, 112th Convention, May 10-13, 2002, pp. 1-5.
Herre et al., "Enhancing the Performance of Perceptual Audio Coders by Using Temporal Noise Shaping (TNS)," Audio Engineering Society, Convention Paper 4384,101st Convention, Nov. 8-11, 1996, pp. 1-17.
Herre et al., "Continuously Signal-Adaptive Filterbank for High-Quality Perceptual Audio Coding," IEEE ASSP Workshop on Applications of Signal Processing to Audio and Acoustics, 1997, 4 pages.
"ANSI SI.4-1983: Specification for Sound Level Meters," 1983, 31 pages.
"ANSI S1.42-2001: Design Response of Weighting Networks for Acoustical Measurement", 2001, 29 pages.
Fletcher et al., "Loudness, Its Definition, Measurement and Calculation," J. Acoust. Soc. Amer., vol. 5, Oct. 1933, pp. 82-108.
"Method for the Subjective Assessment of Intermediate Quality Level of Coding Systems," Recommendation ITU-R BS. 1534-1, 2001-2003, pp. 1-18.
"Methods for the Subjective Assessment of Small Impairments in Audio Systems Including Multichannel Sound Systems," Recommendation ITU-R BS. 1116-1, 1994-1997, pp. 1-26.
Röbel, "A New Approach to Transient Processing in the Phase Vocoder," Proc. of the 6th Int. Conference on Digital Audio Effects (DAFx-03), Sep. 8-11, 2003, pp. DAFX-1 to DAFX-6.
Röbel, "Transient Detection and Preservation in the Phase Vocoder," Proc. ICMC'03, 2003, pp. 247-250.
Every et al., "Separation of Synchronous Pitched Notes by Spectral Filtering of Harmonics," IEEE Transactions on Audio, Speech, and Language Processing, vol. 14, No. 5, Sep. 2006, pp. 1845-1856.
Laroche, "Frequency-Domain Techniques for High-Quality Voice Modification," Proc. of the 6th Int. Conference of Digital Audio Effects (DAFx-03), Sep. 8-11, 2003, pp. DAFX-1 to DAFX-5.
Klapuri, "Multiple Fundamental Frequency Estimation Based on Harmonicity and Spectral Smoothness," IEEE Transaction on Speech and Audio Processing, vol. 11, No. 6, Nov. 2003, pp. 804-816.
Juillerat et al., "A Hybrid Time and Frequency Domain Audio Pitch Shifting Algorithm," Audio Engineering Society, Convention Paper 7637, 125th Convention, Oct. 2-5, 2008, pp. 1-10.
Disch, "Apparatus and Method for Modifying an Audio Signal Using Envelope Shaping," U.S. Appl. No. 13/588,177, filed Aug. 17, 2012.
English translation of Official Communication issued in corresponding Japanese Patent Application No. 2012-554355, mailed on Dec. 17, 2013.
Official Communication issued in corresponding Japanese Patent Application No. 2012-554354, mailed on Nov. 12, 2013.
Official Communication issued in corresponding Taiwanese Patent Application No. 100105447, mailed on Jun. 24, 2013.
Official Communication issued in corresponding Taiwanese Patent Application No. 100105449, mailed on Jun. 24, 2013.
English Translation of Official Communication issued in corresponding Russian Patent Application No. 2012 140 725, mailed on Dec. 29, 2014.

\* cited by examiner

APPARATUS AND METHOD FOR MODIFYING AN AUDIO SIGNAL USING HARMONIC LOCKING

CROSS-REFERENCE TO RELATED APPLICATIONS

This application is a continuation of copending International Application No. PCT/EP2011/052834, filed Feb. 25, 2011, which is incorporated herein by reference in its entirety, and additionally claims priority from U.S. Application No. 61/308,513, filed Feb. 26, 2010, and European Application No. EP 10175282.2, filed Sep. 3, 2010, both of which are also incorporated herein by reference in their entirety.

Embodiments according to the invention relate to audio processing and particularly to an apparatus and a method for modifying an audio signal.

BACKGROUND OF THE INVENTION

There is an increasing demand for digital signal processing techniques that address the need for extreme signal manipulations in order to fit pre-recorded audio signals, e.g. taken from a database, into a new musical context. In order to do so, high level semantic signal properties like pitch, musical key and scale mode are needed to be adapted. All these manipulations have in common that they aim at substantially altering the musical properties of the original audio material while preserving subjective sound quality as good as possible. In other words, these edits strongly change the audio material musical content but, nevertheless, may be used to preserve the naturalness of the processed audio sample and thus maintain believability. This ideally involves signal processing methods that are broadly applicable to different classes of signals including polyphonic mixed music content.

Today, many concepts for modifying audio signals are known. Some of these concepts are based on vocoders.

For example, in "S. Disch and B. Edler, "An amplitude- and frequency modulation vocoder for audio signal processing," Proc. of the Int. Conf on Digital Audio Effects (DAFx), 2008.", "S. Disch and B. Edler, "Multiband perceptual modulation analysis, processing and Synthesis of audio signals," Proc. of the IEEE-ICASSP, 2009." or "S. Disch and B. Edler, "An iterative segmentation algorithm for audio signal spectra depending on estimated local centers of gravity," 12th International Conference on Digital Audio Effects (DAFx-09), 2009.", the concept of the modulation vocoder (MODVOC) has been introduced and its general capability to perform a meaningful selective transposition on polyphonic music content has been pointed out. This renders applications possible which aim at changing the key mode of pre-recorded PCM music samples (see for example "S. Disch and B. Edler, "Multiband perceptual modulation analysis, processing and Synthesis of audio signals," Proc. of the IEEE-ICASSP, 2009."). Also a first commercially available software which can handle such a polyphonic manipulation task (Melodyne editor by Celemony) is available. The software implements a technology which has been branded and marketed by the term direct note access (DNA). A patent application (EP2099024, P. Neubäcker, "Method for acoustic object-oriented analysis and note object-oriented processing of polyphonic sound recordings," September 2009.) has been published lately, presumably covering and thus disclosing the essential functionality of DNA. Independent from the method used for modifying an audio signal, it is desired to obtain an audio signal with high perceptual quality.

SUMMARY

According to an embodiment, an apparatus for modifying an audio signal may have: a filterbank processor configured to generate a plurality of bandpass signals based on an audio signal; a fundamental determiner configured to select a bandpass signal of the plurality of bandpass signals to acquire a fundamental bandpass signal; an overtone determiner configured to identify a bandpass signal of the plurality of bandpass signals fulfilling an overtone criterion regarding the selected fundamental bandpass signal to acquire an overtone bandpass signal associated to the selected fundamental bandpass signal; a signal processor configured to modify the selected fundamental bandpass signal based on a predefined modification target and configured to modify an identified overtone bandpass signal associated to the selected fundamental bandpass signal depending on the modification of the selected fundamental bandpass signal, wherein the signal processor is configured to generate an amplitude modulated signal and a frequency modulated signal for each bandpass signal of the plurality of bandpass signals, wherein the signal processor is configured to modify the frequency modulated signal of the selected fundamental bandpass signal based on the predefined modification target, and wherein the signal processor is configured to modify the frequency modulated signal of the identified overtone bandpass signal associated to the selected fundamental bandpass signal depending on the modification of the selected fundamental bandpass signal; and a combiner configured to combine the modified fundamental bandpass signal, the modified overtone bandpass signal and non selected bandpass signals of the plurality of bandpass signals to acquire a modified audio signal.

According to another embodiment, a method for modifying an audio signal may have the steps of: generating a plurality of bandpass signals based on an audio signal; selecting a bandpass signal of the plurality of bandpass signals to acquire a fundamental bandpass signal; identifying a bandpass signal of the plurality of bandpass signals fulfilling an overtone criterion regarding the selected fundamental bandpass signal to acquire an overtone bandpass signal associated to the selected fundamental bandpass signal; modifying the selected fundamental bandpass signal based on a predefined modification target by generating an amplitude modulated signal and a frequency modulated signal for each bandpass signal of the plurality of bandpass signals and by modifying the frequency modulated signal of the selected fundamental bandpass signal based on the predefined modification target, modifying an identified overtone bandpass signal associated to the selected fundamental bandpass signal depending on the modification of the selected fundamental bandpass signal by modifying the frequency modulated signal of the identified overtone bandpass signal associated to the selected fundamental bandpass signal depending on the modification of the selected fundamental bandpass signal; and combining the modified fundamental bandpass signal, the modified overtone bandpass signal and non selected bandpass signals of the plurality of bandpass signals to acquire a modified audio signal.

Another embodiment may have: a computer program with a program code for performing the method for modifying an audio signal, which method may have the steps of: generating a plurality of bandpass signals based on an audio signal; selecting a bandpass signal of the plurality of bandpass signals to acquire a fundamental bandpass signal; identifying a bandpass signal of the plurality of bandpass signals fulfilling an overtone criterion regarding the selected fundamental bandpass signal to acquire an overtone bandpass signal associated to the selected fundamental bandpass signal; modifying the selected fundamental bandpass signal based on a predefined modification target by generating an amplitude modulated signal and a frequency modulated signal for each bandpass signal of the plurality of bandpass signals and by modifying the frequency modulated signal of the selected fundamental bandpass signal based on the predefined modification target, modifying an identified overtone bandpass signal associated to the selected fundamental bandpass signal depending on the modification of the selected fundamental bandpass signal by modifying the frequency modulated signal of the identified overtone bandpass signal associated to the selected fundamental bandpass signal depending on the modification of the selected fundamental bandpass signal; and combining the modified fundamental bandpass signal, the modified overtone bandpass signal and non selected bandpass signals of the plurality of bandpass signals to acquire a modified audio signal, when the computer program runs on a digital signal processor, a computer or a micro controller.

By identifying overtones of fundamental frequencies and modifying the overtones in the same way as the corresponding fundamentals, a different modification of fundamentals and their overtones can be avoided, so that the timbre of a modified audio signal can be preserved more accurately in comparison to the original audio signal. In this way, the perceptual quality of the modified audio signal can be significantly improved. For example, if a selective pitch transposition is desired (e.g., alter the key mode from C major to C minor of a given music signal), the modification of an identified overtone bandpass signal is correlated to the modification of the fundamental bandpass signal. In comparison, known methods modify the frequency region of the bandpass signal representing overtones differently from the fundamental bandpass signal. In other words, an identified overtone bandpass signal is locked to the fundamental bandpass signal by using the described concept.

In some embodiments of the invention, an overtone bandpass signal may be identified by comparing frequencies of the fundamental bandpass signal and bandpass signals of the plurality of bandpass signals, by comparing an energy content of the fundamental bandpass signal and a bandpass signal of the plurality of bandpass signals and/or by evaluating a correlation of a temporal envelope of the fundamental bandpass signal and temporal envelope of a bandpass signal of the plurality of bandpass signals. In this way, one or more overtone criterions may be defined to minimize the identification of wrong overtones.

Some embodiments according to the invention related to an iterative determination of fundamental bandpass signals and identification of overtone bandpass signals from the plurality of bandpass signals. Already selected fundamental bandpass signals and already identified overtone bandpass signals may be removed from the search space or in other words, may not be considered for the determination of a further fundamental bandpass signal or a further overtone bandpass signal. In this way, each bandpass signal of the plurality of bandpass signals may be selected as a fundamental bandpass signal (and, therefore, may be modified independent from the other fundamental bandpass signals) or an overtone bandpass signal (and, therefore, may be modified depending on the associated selected fundamental bandpass signal).

Another embodiment of the invention provides an apparatus for modifying an audio signal comprising an envelope shaped determiner, a filter bank processor, a signal processor, a combiner and an envelope shaper. The envelope shape determiner is configured to determine envelope shape coefficients based on a frequency domain audio signal representing a time domain input audio signal. Further, the filter bank processor is configured to generate a plurality of bandpass signals in a subband domain based on the frequency domain audio signal. The signal processor is configured to modify a subband domain bandpass signal of the plurality of subband domain bandpass signals based on a predefined modification target. Further, the combiner is configured to combine at least a subset of the plurality of subband domain bandpass signals to obtain a time domain audio signal. Additionally, the envelope shaper is configured to shape an envelope of the time domain audio signal based on the envelope shape coefficients, to shape an envelope of the plurality of subband domain bandpass signals containing the modified subband domain bandpass signal based on the envelope shape coefficients or to shape an envelope of the plurality of subband domain bandpass signals based on the envelope shape coefficients before a subband domain bandpass signal is modified by the signal processor to obtain a shaped audio signal.

By determining envelope shape coefficients of the frequency domain audio signal before the frequency domain audio signal is separated in a plurality of subband domain bandpass signals, an information about the spectral coherence of the audio signal can be preserved and can be used for shaping the envelope of the time domain audio signal after the modification of one or more subband domain bandpass signals. In this way, the spectral coherence of the modified audio signal can be preserved more accurately, although only some (or only one) subband domain bandpass signals are modified or subband domain bandpass signals are modified differently, which may disturb the spectral coherence of the audio signal. In this way, the perceptual quality of the modified audio signal can be significantly improved.

Some embodiments according to the invention relate to a signal processor configured to modify a second subband domain bandpass signal of the plurality of subband domain bandpass signals based on a second predefined modification target. The predefined modification target and the second predefined modification target are different. Although bandpass signals are modified differently, the spectral coherence of the modified audio signal can be preserved more accurately due to the envelope shaping after the individual modification of the bandpass signals.

BRIEF DESCRIPTION OF THE DRAWINGS

Embodiments of the present invention will be detailed subsequently referring to the appended drawings, in which.

DETAILED DESCRIPTION OF THE INVENTION

Figure 1:
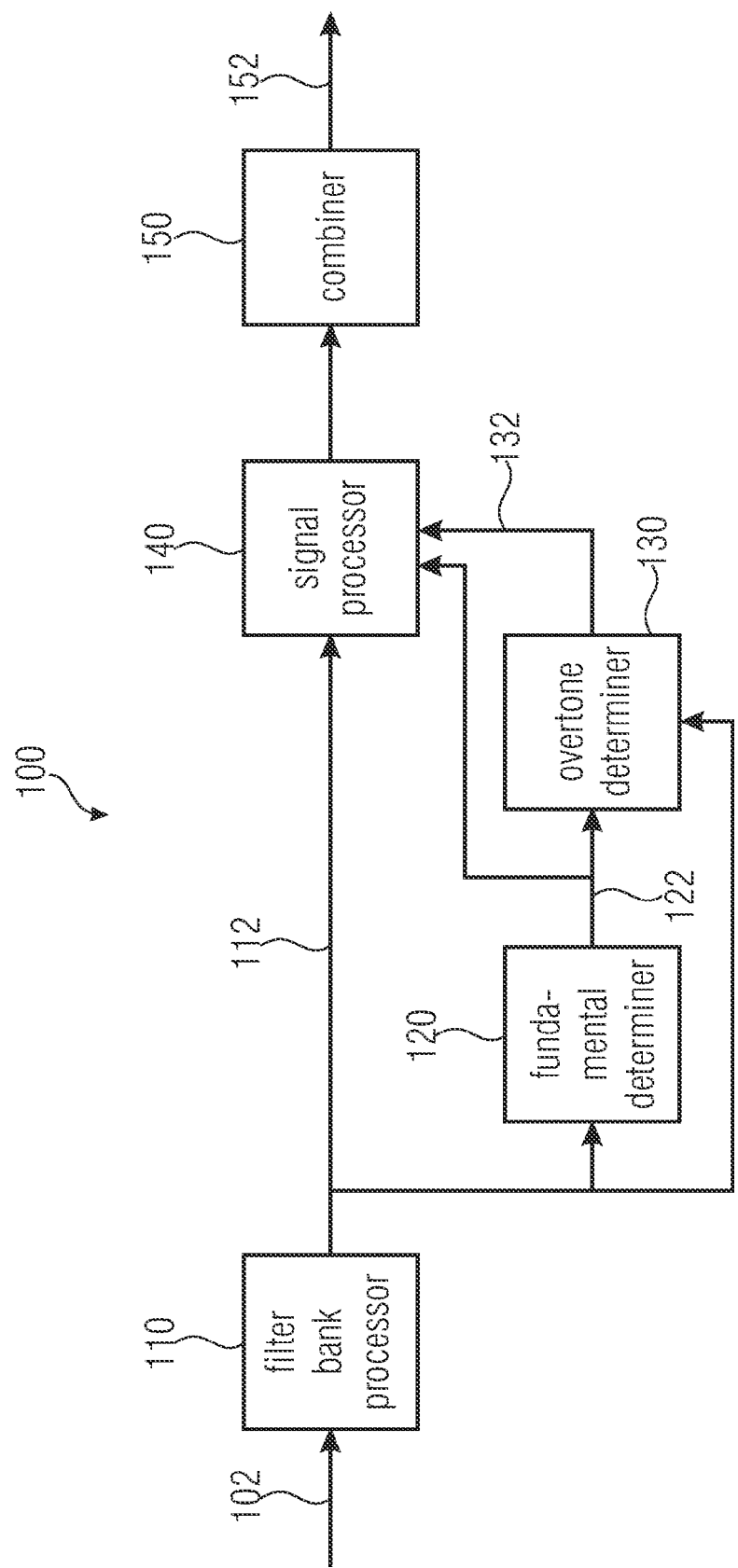
FIG. 1 is a block diagram of an apparatus for modifying an audio signal.

In the following, the same reference numerals are partly used for objects and functional units having the same or similar functional properties and the description thereof with regard to a figure shall apply also to other figures in order to reduce redundancy in the description of the embodiments.

A selective frequency band modification, also called selective pitch transposition, may be realized, for example, by a vocoder or modulation vocoder.

A multiband modulation decomposition (see for example "S. Disch and B. Edler, "Multiband perceptual modulation analysis, processing and Synthesis of audio signals," Proc. of the IEEE-ICASSP, 2009.") dissects the audio signal into a signal adaptive set of (analytic) bandpass signals, each of which is further divided into a sinusoidal carrier and its amplitude modulation (AM) and frequency modulation (FM). The set of bandpass filters may be computed such that on the one hand the Full-hand spectrum is covered seamlessly and on the other hand the filters are aligned with total centers of gravity (COGs), for example. Additionally, the human auditory perception may be accounted for by choosing the bandwidth of the filters to match a perceptual scale e.g. the ERB scale (see for example "B. C. J. Moore and B. R. Glasberg, "A revision of zwicker's loudness model" ActaAcustica, vol. 82, pp. 335-345, 1996.").

For example, the local COG corresponds to the mean frequency that is perceived by a listener due to the spectral contributions in that frequency region. Moreover, the bands centered at local COG positions may correspond to regions of influence based phase locking of classic phase vocoders (see for example "J. Laroche and M. Dolson, "Improved phase vocoder timescale modification of audio," IEEE Transactions on Speech and Audio Processing, vol. 7, no. 3, pp. 323-332, 1999." or "C. Duxbury, M. Davies, and M. Sandler, "Improved timescaling of musical audio using phase locking at transients," in 112th AES Convention, 2002."). The bandpass signal envelope representation and the traditional region of influence phase locking both preserve the temporal envelope of a bandpass signal: either intrinsically or, in the latter case, by ensuring local spectral phase coherence during synthesis. With respect to a sinusoidal carrier of a frequency corresponding to the estimated local COG, both AM and FM are captured in the amplitude envelope and the heterodyned phase of the analytic bandpass signals, respectively. A dedicated synthesis method renders the output signal from the carrier frequencies, AM and FM.

Figure 13:
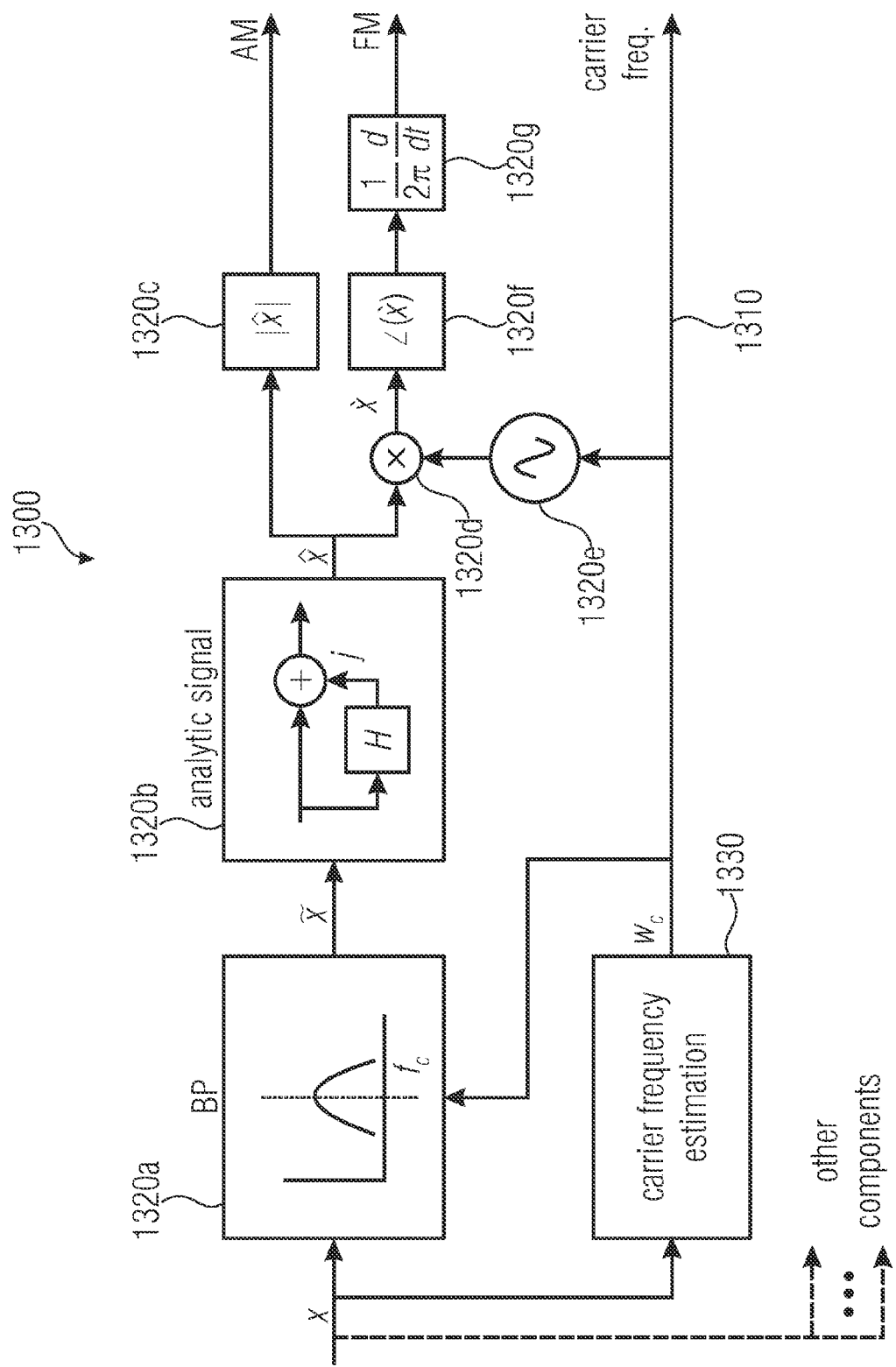
FIG. 13 is a schematic illustration of an modulation analysis.

A block diagram of a possible implementation 1300 of the signal decomposition into carrier signals and their associated modulation components is depicted in FIG. 13. In the figure, the schematic signal flow for the extraction of one of the multiband components (bandpass signals) is shown. All other components are obtained in a similar fashion. First, a broadband input signal x is fed into a bandpass filter that has been designed signal adaptively yielding an output signal. Next, the analytic signal is derived by the Hilbert transform according to Equation (1).

$$\hat{\chi}(t) = \overline{\chi}(t) + jH(\overline{\chi}(t)) \tag{1}$$

The AM (amplitude modulation signal) is given by the amplitude envelope of $\hat{\chi}$ $$AM(t) = |\hat{\chi}(t)| \tag{2}$$

while the FM (frequency modulation signal) is obtained by the phase derivative of the analytic signal heterodyned by a stationary sinusoidal carrier with angular frequency $\omega_c$. The carrier frequency is determined to be an estimate of the local COG. Hence the FM can be interpreted as the IF (instantaneous frequency) variation at the carrier frequency fc.

$$\dot{x}(t) = \hat{x}(t) \cdot \exp(-j\omega_c t) \tag{3}$$

$$FM(t) = \frac{1}{2\pi} \cdot \frac{d}{dt} \angle(\dot{x}(t))$$

The estimation of local COG and the signal adaptive design of the front-end filterbank is described, for example, in a dedicated publication (see "S. Disch and B. Edler, "An iterative segmentation algorithm for audio signal spectra depending on estimated local centers of gravity," 12th International Conference on Digital Audio Effects (DAFx-09), 2009.").

Figure 14:
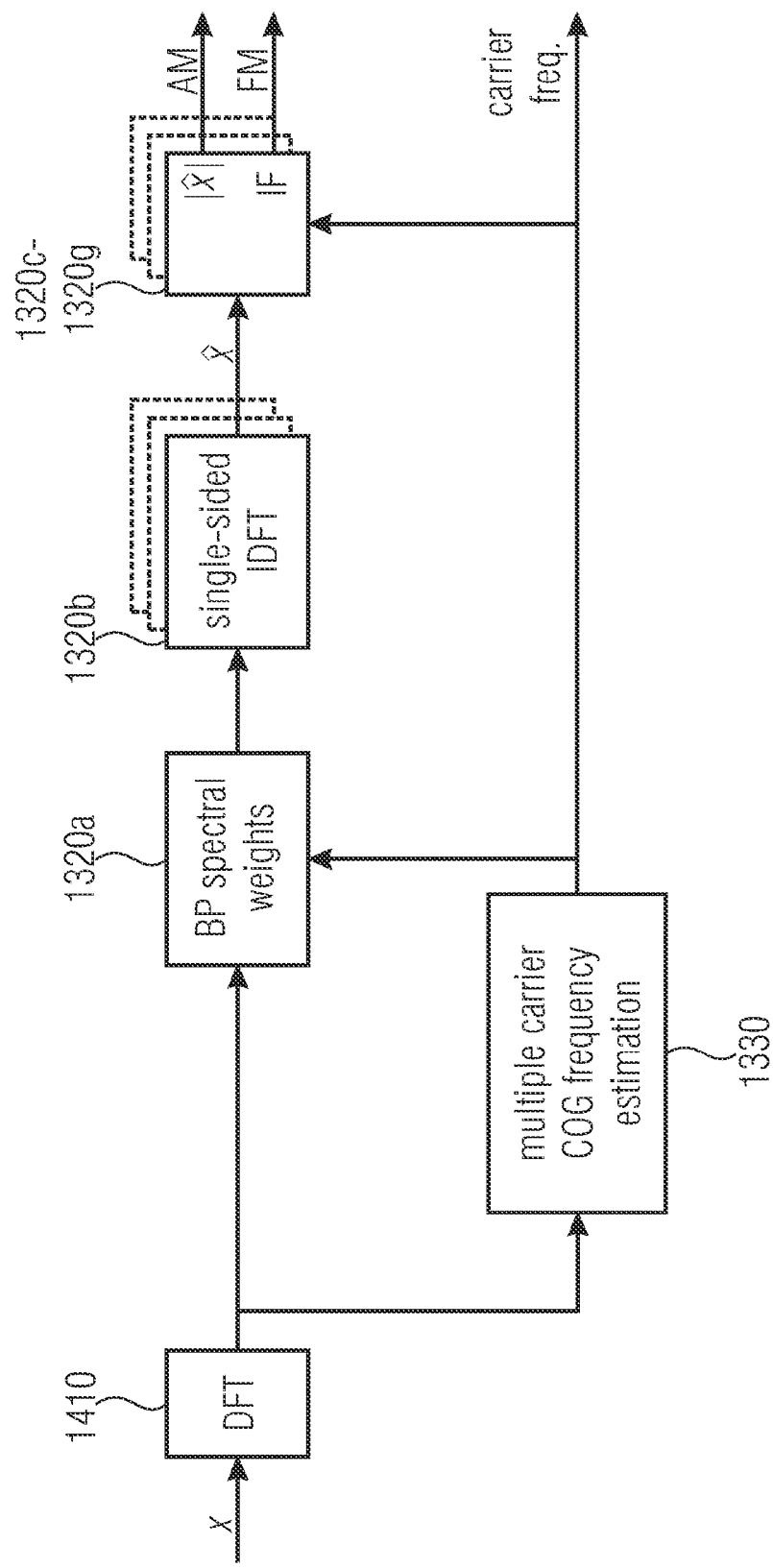
FIG. 14 is a schematic illustration of an implementation of a modulation analysis.

Practically, in a discrete time system, the component extraction may be carried out jointly for all components as illustrated in FIG. 14. The processing scheme may support real-time computation. The processing of a certain time block is only dependent on parameters of previous blocks. Hence, no look-ahead is required in order to keep the overall processing delay as low as possible. The processing is computed on a block-by-block basis using e.g. 75% analysis block overlap and application of a discrete Fourier transform (DFT) on each windowed signal block. The window may be a flat top window according to Equation (4). This ensures that the centered N/2 samples that are passed on for the subsequent modulation synthesis utilizing 50% overlap are unaffected by the skirts of the analysis window. A higher degree of overlap may be used for improved accuracy at the cost of increased computational complexity.

$$\text{window}(i)_{analysis} = \begin{cases} \sin^2\left(\frac{2i\pi}{N}\right) & 0 < i < \frac{N}{4} \\ 1 & \frac{N}{4} \le i < \frac{3N}{4} \\ \sin^2\left(\frac{2i\pi}{N}\right) & \frac{3N}{4} \le i < N \end{cases} \tag{4}$$

Given the spectral representation, next a set of signal adaptive spectral bandpass weighting functions that is aligned with local COG positions is calculated. After application of the bandpass weighting to the spectrum, the signal is transferred into the time domain and the analytic signal may be derived by Hilbert transform. These two processing steps can be efficiently combined by calculation of a single-sided IDFT on each bandpass signal. Given the discrete time bandpass signal, the estimation of the IF by equation (3) is implemented by phase differencing as defined in Equation (5) where * denotes the complex conjugate. This expression is conveniently used since it avoids phase ambiguities and hence the need for phase unwrapping.

$$FM(n) = \angle(\grave{\chi}(n)\grave{\chi}(n-1)^*) \quad (5)$$

The signal is synthesized on an additive basis of all components. Successive blocks are blended by overlap-add (OLA) which is controlled by the bonding mechanism. The component bonding ensures a smooth transition between the borders of adjacent blocks even if the components are substantially altered by a modulation domain processing. The bonding does only take the previous block into account thus potentially allowing for real-time processing. The bonding essentially performs a pair-wise match of the components of the actual block to their predecessors in the previous block. Additionally, the bonding aligns the absolute component phases of the actual block to the ones of the previous block. For components that have no match across time blocks, a fade-in or fade-out is applied, respectively.

Figure 15:
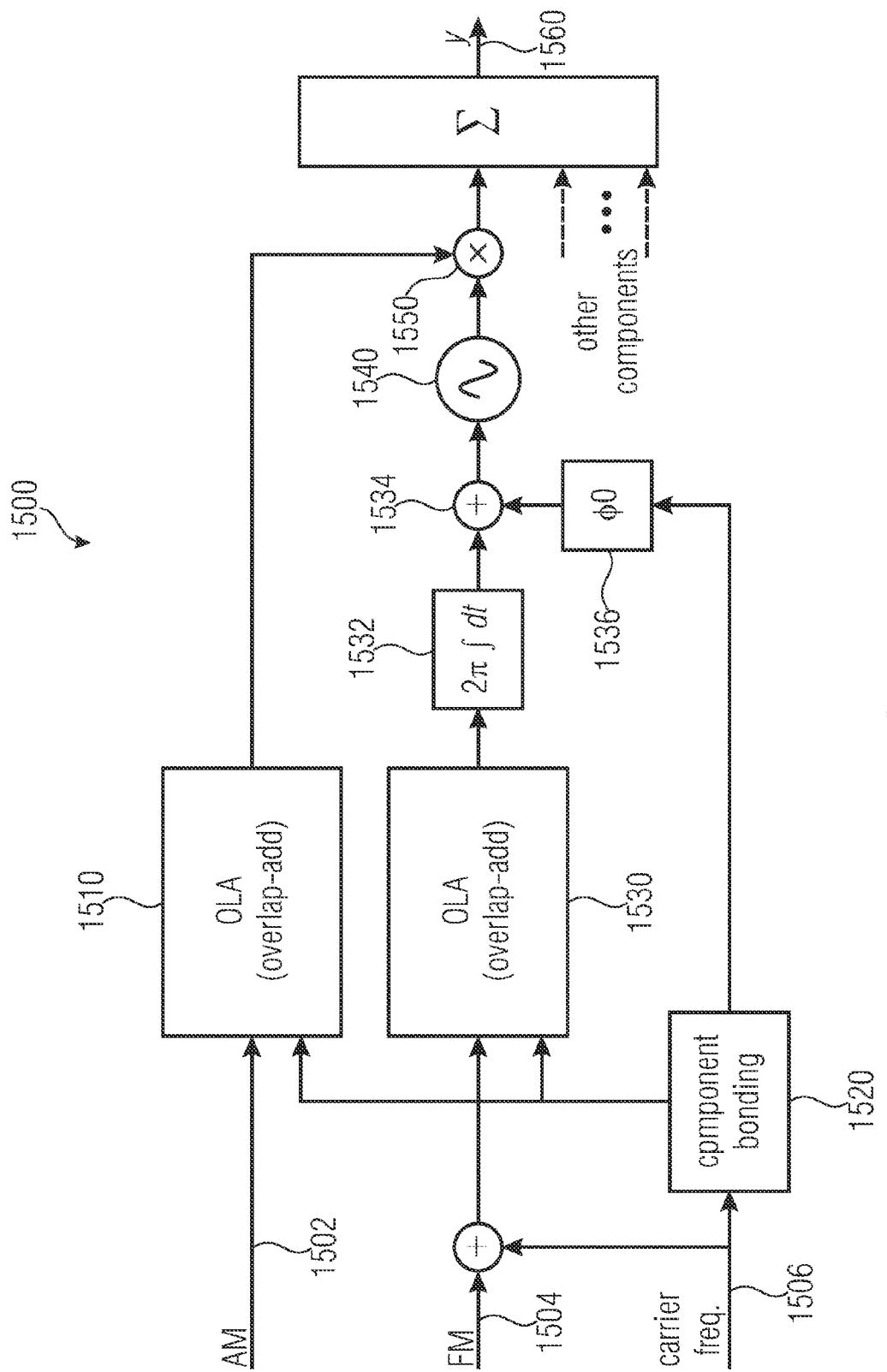
FIG. 15 is a schematic illustration of a modulation synthesis.

For one component the processing chain is shown in FIG. 15. In detail, first the FM signal is added to the stationary carrier frequency and the resulting signal is passed on to an OLA stage, the output of which is temporally integrated subsequently. A sinusoidal oscillator is fed by the resulting phase signal. The AM signal is processed by a second OLA stage. Next, the output of the oscillator is modulated in its amplitude by the AM signal to obtain the additive contribution of the component to the output signal. In a final step, the contributions of all components are summed to obtain the output signal y.

In other words, FIGS. 13 and 14 illustrate a modulation analyzer 1300. The modulation analyzer 1300 advantageously comprises a bandpass filter 1320a, which provides a bandpass signal. This is input into an analytic signal converter 1320b. The output of block 1320b is useful for calculating AM information and FM information. For calculating the AM information, the magnitude of the analytical signal is calculated by block 1320c. The output of the analytical signal block 1320b is input into a multiplier 1320d, which receives, at its other input, an oscillator signal from an oscillator 1320e, which is controlled by the actual carrier frequency $f_c$ 1310 of the band pass 1320a. Then, the phase of the multiplier output is determined in block 1320f. The instantaneous phase is differentiated at block 1320g in order to finally obtain the FM information. In addition, FIG. 14 shows a preprocessor 1410 generating a DFT spectrum of the audio signal.

The multiband modulation decomposition dissects the audio signal into a signal adaptive set of (analytic) bandpass signals, each of which is further divided into a sinusoidal carrier and its amplitude modulation (AM) and frequency modulation (FM). The set of bandpass filters is computed such that on the one hand the fullband spectrum is covered seamlessly and on the other hand the filters are aligned with local COGs each. Additionally, the human auditory perception is accounted for by choosing the bandwidth of the filters to match a perceptual scale e.g. the ERB scale (see "B. C. J. Moore and B. R. Glasberg, "A revision of Zwicker's loudness model," Acta Acustica, vol. 82, pp. 335-345, 1996").

The local COG corresponds to the mean frequency that is perceived by a listener due to the spectral contributions in that frequency region. Moreover, the bands centered at local COG positions correspond to regions of influence based phase locking of classic phase vocoders (see "J. Laroche and M. Dolson, "Improved phase vocoder timescale modification of audio", IEEE Transactions on Speech and Audio Processing, vol. 7, no. 3, pp. 323-332, 1999", "Ch. Duxbury, M. Davies, and M. Sandler, "Improved timescaling of musical audio using phase locking at transients," in $112^{th}$ AES Convention, 2002", "A. Robel, "A new approach to transient processing in the phase vocoder," Proc. Of the Int. Conf. on Digital Audio Effects (DAFx), pp. 344-349, 2003", "A. Robel, "Transient detection and preservation in the phase vocoder", Int. Computer Music Conference (ICMC'03), pp. 247-250, 2003"). The bandpass signal envelope representation and the traditional region of influence phase locking both preserve the temporal envelope of a bandpass signal: either intrinsically or, in the latter case, by ensuring local spectral phase coherence during synthesis. With respect to a sinusoidal carrier of a frequency corresponding to the estimated local COG, both AM and FM are captured in the amplitude envelope and the heterodyned phase of the analytical bandpass signals, respectively. A dedicated synthesis method renders the output signal from the carrier frequencies, AM and FM.

Figure 12:
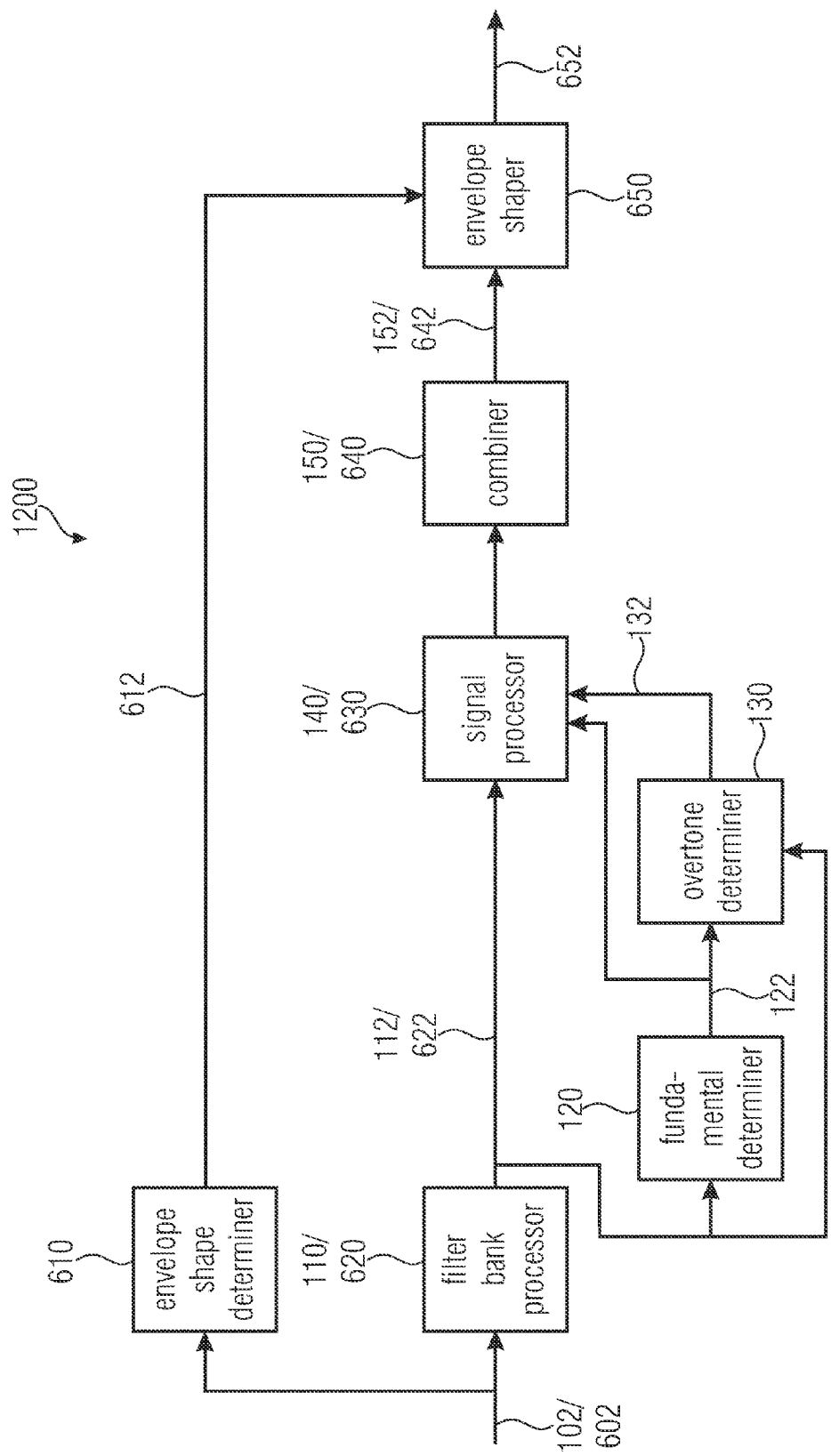
FIG. 12 is a block diagram of an apparatus for modifying an audio signal.

A block diagram of the signal decomposition into carrier signals and their associated modulation components is depicted in FIG. 12. In the picture, the schematic signal flow for the extraction of one component is shown. All other components are obtained in a similar fashion. Practically, the extraction is carried out jointly for all components on a block-by-block basis using e.g. a block size of $N=2^{14}$ at 48 kHz sampling frequency and 75% analysis overlap—roughly corresponding to a time interval of 340 ms and a stride of 85 ms—by application of a discrete Fourier transform (DFT) on each windowed signal block. The window may be a 'flat top' window according to Equation (a). This may ensure that the centered N/2 samples that are passed on for the subsequent modulation synthesis are unaffected by the slopes of the analysis window. A higher degree of overlap may be used for improved accuracy at the cost of increased computational complexity.

$$window(i)_{analysis} = \begin{cases} \sin^2\left(\frac{2i\pi}{N}\right) & 0 < i < \frac{N}{4} \\ 1 & \frac{N}{4} \leq i < \frac{3N}{4} \\ \sin^2\left(\frac{2iN}{N}\right) & \frac{3N}{4} \leq i < N \end{cases} \quad (a)$$

Given the spectral representation, next a set of signal adaptive spectral weighting functions (having bandpass characteristic) that is aligned with local COG positions may be calculated (by the carrier frequency determiner 1330 in terms of a carrier frequency estimation or a multiple carrier COG frequency estimation). After application of the bandpass weighting to the spectrum, the signal is transformed to the time domain and the analytic signal is derived by Hilbert transform. These two processing steps can be efficiently combined by calculation of a single-sided IDFT on each bandpass signal. Subsequently, each analytic signal is heterodyned by its estimated carrier frequency. Finally, the signal is further decomposed into its amplitude envelope and its instantaneous frequency (IF) track, obtained by computing the phase derivative, yielding the desired AM and FM signal (see also "S. Disch and B. Edler, "An amplitude- and frequency modulation vocoder for audio signal processing," Proc. of the Int. Conf. on Digital Audio Effects (DAFx), 2008").

Fittingly, FIG. 15 shows a block diagram of a modification synthesizer 1500 a parameterized representation of an audio signal. For example, an advantageous implementation is based on an overlap-add operation (OLA) in the modulation domain, i.e., in the domain before generating the time domain band pass signal. The input signal which may be a bitstream, but which may also be a direct connection to an analyzer or modifier as well, is separated into the AM component 1502, the FM component 1504 and the carrier frequency component 1506. The AM synthesizer advantageously comprises an overlap-adder 1510 and, additionally, a component bonding controller 1520 which, advantageously not only comprises block 1510 but also block 1530, which is an overlap adder within the FM synthesizer. The FM synthesizer additionally comprises a frequency overlap-adder 1530, an instantaneous frequency integrator 1532, a phase combiner 1534 which, again, may be implemented as a regular adder and a phase shifter 1536 which is controllable by the component bonding controller 1520 in order to regenerate a constant phase from block to block so that the phase of a signal from a preceding block is continuous with the phase of an actual block. Therefore, one can say that the phase addition in elements 1534, 1536 corresponds to a regeneration of a constant that was lost during the differentiation in block 1520g in FIG. 13 on the analyzer side. From an information-loss perspective in the perceptual domain, it is to be noted that this is the only information loss, i.e., the loss of a constant portion by the differentiation device 1320g in FIG. 13. This loss can be compensated for by adding a constant phase determined by the component bonding device 1520.

Overlap-add (OLA) is applied in the parameter domain rather than on the readily synthesized signal in order to avoid beating effects between adjacent time blocks. The OLA is controlled by a component bonding mechanism, that, steered by spectral vicinity (measured on an ERB scale), performs a pair-wise match of components of the actual block to their predecessors in the previous block. Additionally, the bonding aligns the absolute component phases of the actual block to the ones of the previous block.

In detail, firstly the FM signal is added to the carrier frequency and the result is passed on to the OLA stage, the output of which is integrated subsequently. A sinusoidal oscillator 1540 is fed by the resulting phase signal. The AM signal is processed by a second OLA stage. Finally, the output of the oscillator is modulated 1550 in its amplitude by the resulting AM signal to obtain the additive contribution of the component to the output signal 1560.

It should be emphasized that an appropriate spectral segmentation of the signal within the modulation analysis is of paramount importance for a convincing result of any further modulation parameter processing. Therefore, herein, an example for a suitable segmentation algorithm is described.

Figure 16:
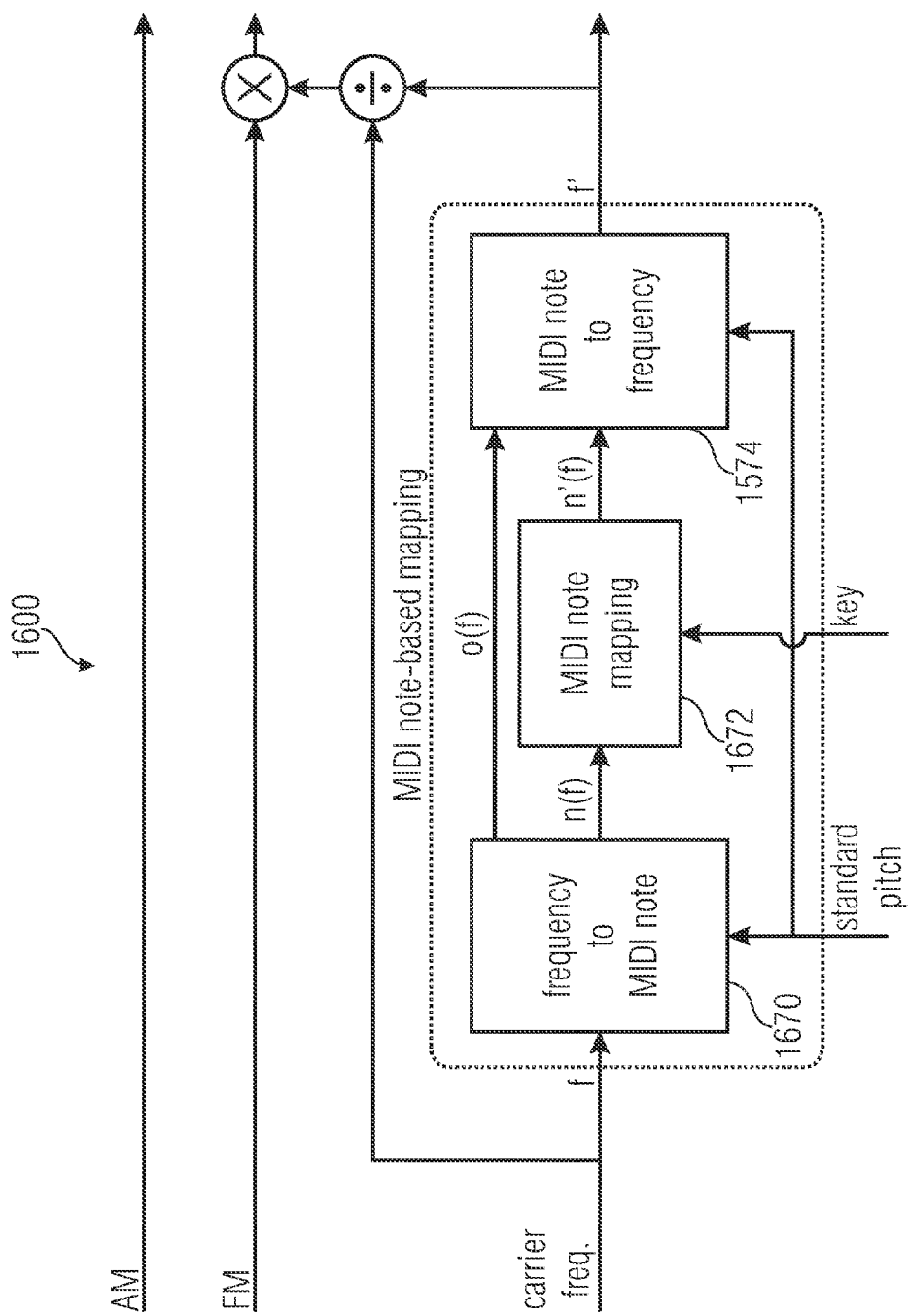
FIG. 16 is a schematic illustration of a selective transposition on a modulation vocoder component.

Fittingly, FIG. 16 shows an example 1600 for an application for polyphonic key mode changes. The figure shows a selective transposition on modulation vocoder components. Carrier frequencies are quantized to MIDI notes which are mapped onto appropriate corresponding MIDI notes. Preservation of relative FM modulation by multiplication of the mapped components by the ratio of original and modified carrier frequency.

Transposing of an audio signal while maintaining original playback speed is a challenging task. Using the proposed system, this is achieved straightforward by multiplication of all carrier components with a constant factor. Since the temporal structure of the input signal is solely captured by the AM signals it is unaffected by the stretching of the carrier's spectral spacing.

An even more demanding effect can be obtained by selective processing. The key mode of a piece of music can be changed from e.g. minor to major or vice versa. Therefore, only a subset of carriers corresponding to certain predefined frequency intervals is mapped to suitable new values. To achieve this, the carrier frequencies are quantized 1670 to MIDI pitches which are subsequently mapped 1672 onto appropriate new MIDI pitches (using a-priori knowledge of mode and key of the music item to be processed).

Then, the mapped MIDI notes are converted back 1574 in order to obtain the modified carrier frequencies that are used for synthesis. A dedicated MIDI note onset/offset detection is not required since the temporal characteristics are predominantly represented by the unmodified AM and thus preserved. Arbitrary mapping tables can be defined enabling for conversion to and from other minor flavours (e.g. harmonic minor).

An application in the realm of audio effects is the global transposition of an audio signal. The processing that may be used for this audio effect is a simple multiplication of the carriers with a constant transposition factor. By also multiplying the FM with the same factor it is ensured that, for each component, the relative FM modulation depth is preserved. Since the temporal structure of the input signal is solely captured by the AM signals it is unaffected by the processing. Global transposition changes the original key of a music signal towards a target key (e.g. from C major to G major) while preserving the original tempo.

However, due to the signal adaptive nature of the proposed modulation analysis, the modulation vocoder has the potential to go beyond this task. Now, even the transposition of selected components of polyphonic music becomes feasible, enabling applications which e.g. alter the key mode (e.g. from C major to C minor) of a given music signal (see for example "S. Disch and B. Edler, "Multiband perceptual modulation analysis, processing and Synthesis of audio signals," Proc. of the IEEE-ICASSP, 2009."). This is possible due to the fact that each component carrier closely corresponds to the perceived pitch in its spectral region. If only carriers that relate to certain original pitches are mapped towards new target values, the overall musical character that is determined by the key mode is manipulated.

The processing on the MODVOC components is depicted in FIG. 16 as mentioned before. Within the MODVOC decomposition domain, the carrier frequencies are quantized to MIDI notes which are subsequently mapped onto appropriate corresponding MIDI notes, For a meaningful reassignment of midi pitches and note names, a-priori knowledge of mode and key of the original music item may be used. The AM of all components is not acted upon at all since these contain no pitch information.

Specifically, the component carrier frequencies f, which represent the component pitch, are converted to MIDI pitch values m according to Equation 6, where $L_{td}$ denotes the standard pitch which corresponds to MIDI pitch 69, the note A0.

$$m(f) = 69 + 12 \cdot \log_2 \frac{|f|}{f_{std}} \qquad (6)$$

$$n(f) = \text{round}(m(f))$$

$$o(f) = m(f) - n(f)$$

$$n \to n'$$

$$n \to n'$$

$$f' = f_{std} 2^{(n'+o(f)-69)/12} \qquad (7)$$

Subsequently MIDI pitches are quantized to MIDI notes n(f) and, additionally, the pitch offset o(f) of each note is determined. By utilization of a MIDI note mapping table which is dependent on key, original mode and target mode, these MIDI notes are transformed to appropriate target values n'. In the Table below, an exemplary mapping is given for key of C from major to natural minor. The table shows an MIDI note mapping table for a scale mode transformation from C major to C natural minor. The mapping applies for the notes of all octaves.

| Original note | Target note |
| --- | --- |
| C | C |
| D | D |
| E | Eb |
| F | F |
| G | G |
| A | Ab |
| B | Bb |

Lastly, the mapped MIDI notes including their pitch offsets are converted back to frequency f' in order to obtain the modified carrier frequencies that are used for synthesis (Equation 7). Additionally, in order to preserve the relative FM modulation depth, the FM of a mapped component is multiplied by the individual pitch transposition factor which is obtained as the ratio of original and modified carrier frequency. A dedicated MIDI note onset/offset detection may not be required since the temporal characteristics are predominantly represented by the unmodified AM and thus are preserved.

The described modulation vocoder is one possibility to modify different frequency ranges (bandpass signals) of audio signals differently, which was mentioned as selective pitch transposition. The inventive concept enables the enhancement of the perceptual quality of such modified audio signals. Although some embodiments of the inventive concept are described in connection with a vocoder or an modulation vocoder it may be used also generally for improving the perceptual quality of modified audio signals independent from the usage of a vocoder.

FIG. 1 shows a block diagram of an apparatus 100 for modifying an audio signal 102 according to an embodiment of the invention. The apparatus 100 comprises a filter bank processor 110, a fundamental determiner 120, an overtone determiner 130, a signal processor 140 and a combiner 150. The filter bank processor 110 is connected to the fundamental determiner 120, the overtone determiner 130 and the signal processor 140 as well as the fundamental determiner 120 is connected to the overtone determiner 130 and the signal processor 140. Further, the overtone determiner 130 is connected to the signal processor 140 and the signal processor 140 is connected to the combiner 150. The filter bank processor 110 generates a plurality of bandpass signals 112 based on an audio signal 102. Further, the fundamental determiner selects a bandpass signal 112 of the plurality of bandpass signals to obtain a fundamental bandpass signal 122. The overtone determiner identifies a bandpass signal 112 of the plurality of bandpass signals fulfilling an overtone criterion regarding the selected fundamental bandpass signal 122 to obtain an overtone bandpass signal 132 associated to the selected fundamental bandpass signal 122. Further, the signal processor 140 modifies the selected fundamental bandpass signal 122 based on a predefined modification target. Additionally, the signal processor 140 modifies an identified overtone bandpass signal 132 associated to the selected fundamental bandpass signal 122 depending on the modification of the selected fundamental bandpass signal 122. The combiner 150 combines the plurality of bandpass signals containing the modified selected fundamental bandpass signal and the modified identified overtone bandpass signal to obtain a modified audio signal 152.

By modifying the fundamental bandpass signal 122 and the identified overtone bandpass signal 132 associated to the fundamental bandpass signal 122 in the same way, a common behavior of these harmonics may be preserved, although other bandpass signals of the plurality of bandpass signals may be modified in different ways. In this way, the timbre of the original audio signal 102 may be maintained more accurately, so that the perceptual quality of the modified audio signal can be significantly improved. For example, most instruments excite harmonic sounds consisting of a fundamental frequency part and its harmonics. If the fundamental frequency part should be modified, then a correlated modification of the harmonics according to the described concept may yield in significantly better perceptive quality of the modified audio signal. Further, the audio signal can be modified in real time, since an a-priori information about the whole audio signal (e.g. the whole polyphonic music title) may not be necessary.

The audio signal 102 may be, for example, a time domain input audio signal or a frequency domain audio signal representing a time domain input audio signal.

The fundamental determiner 120 may provide the selected fundamental bandpass signal 122 to the signal processor 140 for modification or may provide a trigger signal 122 (e.g., an index i∈[0 . . . 1−1] of the selected fundamental bandpass signal, wherein I is the number of bandpass signals of the plurality of bandpass signals) to trigger the signal processor 140 to modify the selected bandpass signal of the plurality of bandpass signals according to the predefined modification target. Consequently, also the overtone determiner 130 may provide the identified overtone bandpass signal 132 for modification to the signal processor 140 or may provide a trigger signal 132 (e.g., an index indicating the bandpass signal of the plurality of bandpass signals being identified as overtone bandpass signal) to trigger the signal processor 140 to modify the identified bandpass signal of the plurality of bandpass signals.

The overtone criterion may comprise one or more rules to identify an overtone of the fundamental. There may be one or more overtone criterion to be fulfilled to identify a bandpass signal of the plurality of bandpass signals as an overtone of the selected fundamental bandpass signal 122.

The predefined modification target may be different for bandpass signals comprising different frequency range and may depend on the desired modification of the audio signal 102. For example, the original key of an audio signal should be changed towards a target key. An exemplary mapping was given for key of C from major to natural minor by the table above. For example, if a frequency range of a bandpass signal of the plurality of bandpass signals corresponds to an original note C, the target note would be C as well, so that this bandpass signal is not modified (except for being identified as overtone bandpass signal of an associated fundamental bandpass signal, which is modified). In this case, the modification target is to keep this bandpass signal unmodified. On the other hand, a bandpass signal of the plurality of bandpass signals comprising a frequency range correlating to an original note A may be modified, so that the modified bandpass signal may contain a frequency range correlating to a target note Ab (except the case, the bandpass signal is identified as an overtone bandpass signal of a fundamental bandpass signal to be modified according to another modification target). Further, identified overtone bandpass signals (bandpass signals comprising a frequency range correlated to an overtone of original note A) may be modified so that the modified overtone bandpass signal comprises a frequency range correlated to an overtone of the target note Ab.

All bandpass signals 112 of the plurality of bandpass signals may comprise a carrier frequency. The carrier frequency may be a characteristic frequency of the frequency range represented by or contained by a bandpass signal, as, for example, a mean frequency of the frequency range, an upper cut-off frequency of the frequency range, a lower cut-off frequency of the frequency range or a center of gravity of the frequency range of the bandpass signal. The carrier frequency of a bandpass signal may be different from the carrier frequency of each other bandpass signals. These carrier frequencies may be used by the overtone determiner 130 to identify overtone bandpass signals. For example, the overtone determiner 130 may compare the carrier frequency of a bandpass signal 112 of the plurality of bandpass signals with the carrier frequency of the selected fundamental bandpass signal 122. Since an overtone may be approximately a multiple of the fundamental frequency, an overtone criterion may be fulfilled, if the carrier frequency of a bandpass signal 112 is a multiple of the carrier frequency of the selected fundamental bandpass signal 122 (with a predefined carrier frequency tolerance, e.g., 100 Hz, 50 Hz, 20 Hz or less). In other words, an overtone criterion may be, for example, that the carrier frequency of a bandpass signal 112 is a multiple of the carrier frequency of the selected fundamental bandpass signal 122 with a predefined carrier frequency tolerance.

Additionally or alternatively, the overtone determiner 130 may compare an energy content of the bandpass signal 112 of the plurality of bandpass signals with an energy content of the selected fundamental bandpass signal 122. In this example, an overtone criterion may be fulfilled, if a ratio of the energy content of the bandpass signal 112 and the energy content of the selected fundamental bandpass signal 122 may be within a predefined energy tolerance range. This overtone criterion takes into account, that usually harmonics exhibit lower energy than the fundamentals. The predefined energy tolerance range may be, for example, from 0.3 to 0.9, 0.5 to 0.8, 0.6 to 0.7 or another range. This energy content based overtone criterion may be combined with the carrier frequency based overtone criterion mentioned above.

Additionally or alternatively, the overtone determiner 130 may calculate correlation value indicating a correlation of a temporal envelope of the bandpass signal 112 of the plurality of the bandpass signals with a temporal envelope of the selected fundamental bandpass signal 122. In this case, an overtone criterion may be fulfilled, if the correlation value is higher than a predefined correlation threshold. This overtone criterion considers the fact that a fundamental and its harmonic share a rather similar temporal envelope. The predefined correlation threshold may be, for example, 0.2, 0.3, 0.4 or more. The described correlation based overtone criterion may be combined with the carrier frequency based overtone criterion and/or the energy content based overtone criterion mentioned above.

The fundamental determiner 120 may select a further bandpass signal 112 of the plurality of bandpass signals without considering all already selected fundamental bandpass signals 122 and all already identified overtone bandpass signals 132. In other words, the fundamental determiner 120 may select iterative fundamental bandpass signals 122 from a set of bandpass signals, which contains bandpass signals not already selected fundamental bandpass signals and already identified overtone bandpass signals 132. This may be done, until all bandpass signals of the plurality of bandpass signals may be either selected as a fundamental bandpass signal or identified as an overtone of a fundamental bandpass signal. Consequently, the overtone determiner 130 may identify a bandpass signal 112 of the plurality of bandpass signals fulfilling an overtone criterion regarding the further selected fundamental bandpass signal without considering all already identified overtone bandpass signals and without considering all already selected fundamental bandpass signals 122.

Further, the signal processor 140 may modify the further selected fundamental bandpass signal 122 based on the further predefined modification target and independent from all other selected fundamental bandpass signals. In other words, for each fundamental bandpass signal or for some of the selected fundamental bandpass signals, different modification targets may be defined. For example, the modification targets may be defined by a table mentioned above indicating a transition from one key note to another. Since the fundamental bandpass signals can be modified independent from each other, for example, also selectively only fundamentals and harmonics of a specific instrument may be modified to change the key mode or the loudness of this instrument.

The bandpass signal 112 may be selected by the fundamental determiner 120 based on an energy criterion. For example, the bandpass signal with the highest or one of the highest energy contents (e.g. higher than 70% or more of the other bandpass signals) may be selected. In this example, an already selected fundamental bandpass signal may be excluded from a further selection by setting an energy content parameter indicating the energy content of the selected fundamental bandpass signal equal to zero. For the selection of the bandpass signal 112, the energy content of each bandpass signal (indicated for example by an energy content parameter determined by the fundamental determiner) may be weighted (e.g., by a-weighting) to emphasize the selection of perceptually important bandpass signals.

The signal processor 140 may modify the selected fundamental bandpass signals 132 and the associated overtone bandpass signals 132 in various ways. For example, the signal processor 140 may modify the selected fundamental bandpass signal 122 by multiplying a carrier frequency of the selected fundamental bandpass signal 122 with a transposition factor (e.g., depending on the key mode change) or by adding a transposition frequency to the carrier frequency of the selected fundamental bandpass signal 122. Further, the signal modifier 140 may modify the identified overtone band pass signal 132 by multiplying a carrier frequency of the identified bandpass signal 132 with the transposition factor (e.g. with a tolerance of 20%, 10%, 5%, 1% or below) or by adding a multiple of the transposition frequency (e.g., with a tolerance of 20%, 10%, 5%, 1% or below) to the carrier frequency of the identified overtone bandpass signal 132. In other words, for example, a key mode change may be realized by multiplying the fundamental and the associated harmonics by the same transposition factor or by adding a transposition frequency to the fundamental and a multiple of the transposition frequency to the overtone. In this way, the identified overtone bandpass signal 132 is modified depending (in the same way) as the selected fundamental bandpass signal 122.

Figure 2:
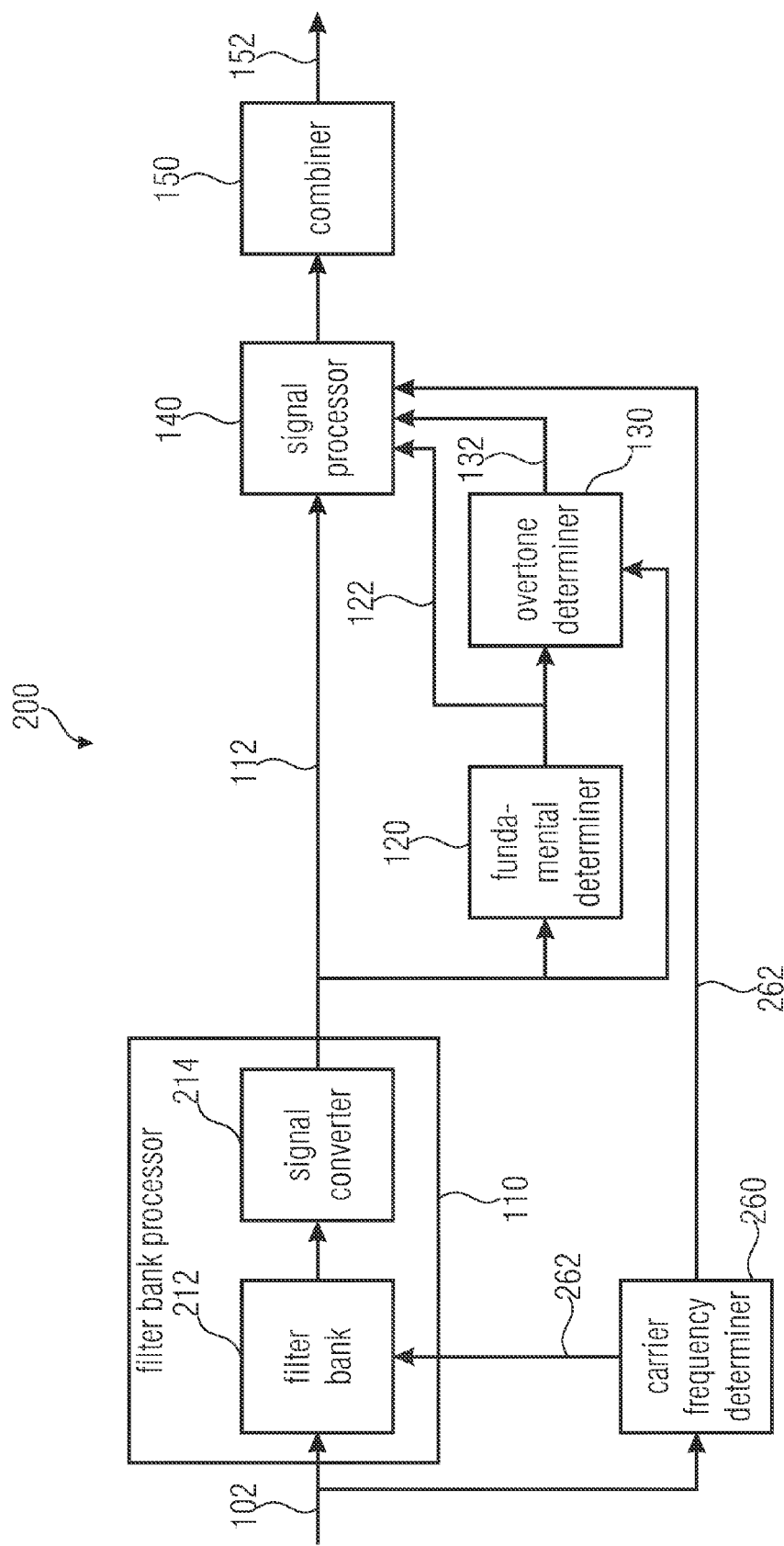
FIG. 2 is a block diagram of an apparatus for modifying an audio signal.
Figure 3:
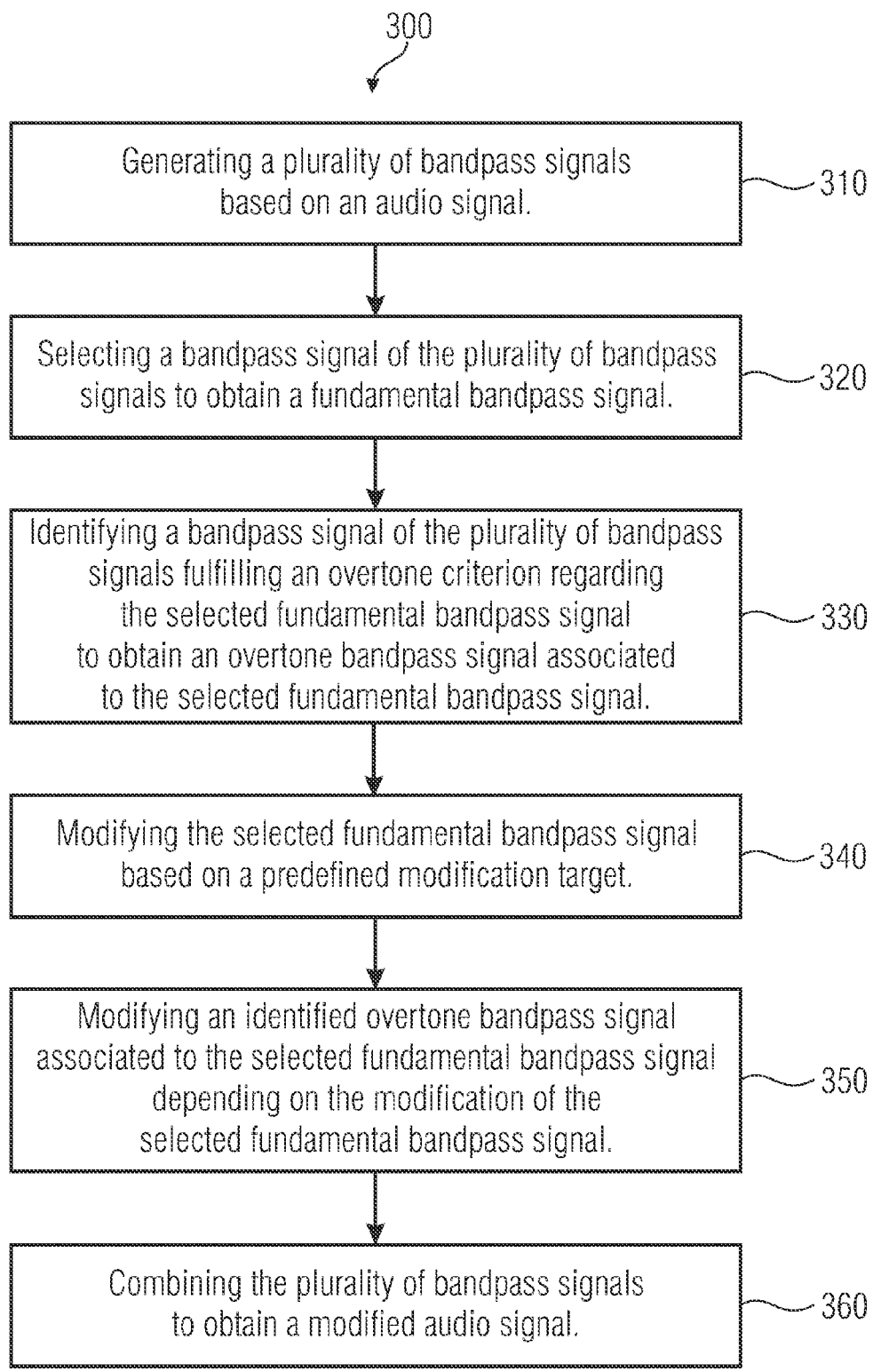
FIG. 3 is a flow chart of a method for modifying an audio signal.

FIG. 2 shows a block diagram of an apparatus 200 for modifying an audio signal 102 according to an embodiment of the invention. The apparatus 200 is similar to the apparatus shown in FIG. 1, but comprises additionally a carrier frequency determiner 260 and the filter bank processor 110 comprises a filter bank 212 and a signal converter 214. The filter bank 212 is connected to the signal converter 214 and the signal converter 214 is connected to the signal processor 140. The optional carrier frequency determiner 260 is connected to the filter bank 212 of the filter bank processor 110 and the signal processor 140.

The filter bank 212 may generate band pass signals based on the audio signal 102 and the signal converter 214 may convert the generated bandpass signals to a subband domain to obtain the plurality of bandpass signals provided to the fundamental determiner 120, the overtone determiner 130 and the signal processor 140. The signal converter 214 may be realized, for example, as a single sided inverse discrete Fourier transform unit, so that each bandpass signal 112 of the plurality of bandpass signals may represent an analytical signal. In this subband domain, the fundamental determiner 120 may select one of these subband domain bandpass signals from the plurality of bandpass signals to obtain the fundamental bandpass signal 122. Further, the overtone determiner may identify one of these subband domain bandpass signals of the plurality of bandpass signals.

Additionally, the carrier frequency determiner 260 may determine a plurality of carrier frequencies based on the audio signal 102 and the filter bank 212 of the filter bank processor 110 may generate the bandpass signals, so that each bandpass signal comprises a frequency range containing a different carrier frequency 262 of the plurality of carrier frequencies to obtain a band pass signal associated to each carrier frequency 262 of the plurality of carrier frequencies. In other words, the bandwidth and the mean frequencies of the bandpass signals generated by the filter bank 212 may be controlled by the carrier frequency determiner 260. This may be done in various ways, for example, by calculating center of gravities (COG) of the audio signal 102, as described above.

As already mentioned above, the bandpass signals 112 may be modified in various ways. For example, the signal processor 140 may generate an amplitude modulation signal (AM) and a frequency modulation signal (FM) for each bandpass signal 112 of the plurality of bandpass signals. Since each bandpass signal represents an analytical signal in the subband domain, the signal processor 140 may generate the amplitude modulation signal and the frequency modulation signal as mentioned before in connection with the modulation vocoder, for example. Further, the signal processor 140 may modify the amplitude modulation signal or the frequency modulation signal of the selected fundamental bandpass signal 122 based on the predefined modification target and may modify the amplitude modulation signal or the frequency modulation signal of the identified overtone bandpass signal 132 associated to the selected fundamental bandpass signal 122 depending on the modification of the selected fundamental bandpass signal 122.

The filter bank processor 110, the fundamental determiner 120, the overtone determiner 130, the signal processor 140, the combiner 150 and/or the carrier frequency determiner 260 may be, for example, individual hardware units or part of a digital signal processor, a computer or micro controller as well as a computer program or software product configured to run on a digital signal processor, computer or micro controller.

Some embodiments according to the invention relate to a method 300 for modifying an audio signal according to an embodiment of the invention. The method 300 may comprise generating 310 a plurality of bandpass signals based on an audio signal and selecting 320 a bandpass signal of the plurality of bandpass signals to obtain a fundamental bandpass signal. Further, the method 300 may comprise identifying 330 a bandpass signal of the plurality of bandpass signals fulfilling an overtone criterion regarding the selected fundamental bandpass signal to obtain an overtone bandpass signal associated to the selected fundamental bandpass signal. Further, the selected fundamental bandpass signal is modified 340 based on a predefined modification target and the identified overtone bandpass signal associated to the selected fundamental bandpass signal is modified 350 depending on the modification of the selected fundamental bandpass signal. Further, the method 300 may comprise combining 360 the plurality of bandpass signals containing the modified selected fundamental bandpass signal and the modified identified overtone bandpass signal to obtain a modified audio signal.

Optionally, the method 300 may comprise additional steps representing the optional features of the inventive concept mentioned above and mentioned in the following.

In the following, the described concept is illustrated in more detail by an example for an implementation using a modulation vocoder, although the proposed concept may also be used more general also for other implementations.

Most instruments excite harmonic sounds consisting of a fundamental frequency part and its harmonics being approximately integer multiples of the fundamental frequency. Since musical intervals obey a logarithmic scale, each harmonic overtone resembles a different musical interval with respect to the fundamental (and its octaves). The table below lists the correspondence of harmonic numbers and musical intervals for the first seven harmonics. The table shows harmonic numbers and related musical intervals with respect to the fundamental and its octaves.

| Harmonic number | | | Interval name |
|---|---|---|---|
| 1 | 2 | 4 | perfect unison (P1) |
| | | | minor second (m2) |
| | | 9 | major second (M2) |
| | | | minor third (m3) |
| | 5 | | major third (M3) |
| | | | perfect fourth (P4) |
| | | | tritone |
| 3 | | 6 | perfect fifth (P5) |
| | | | minor sixth (m6) |
| | | | major sixth (M6) |
| | | 7 | minor seventh (m7) |
| | | | major seventh (M7) |

Thus, in the task of selective transposition of polyphonic music content, there exists an inherent ambiguity with respect to the musical function of a MODVOC component. If the component originates from a fundamental is has to be transposed according to the desired scale mapping, if it is dominated by a harmonic to be attributed to a fundamental it has to be transposed together which this fundamental in order to best preserve the original timbre of the tone. From this there emerges the need for an assignment of each MODVOC component (bandpass signal) in order to select the most appropriate transposition factor.

Figure 5:
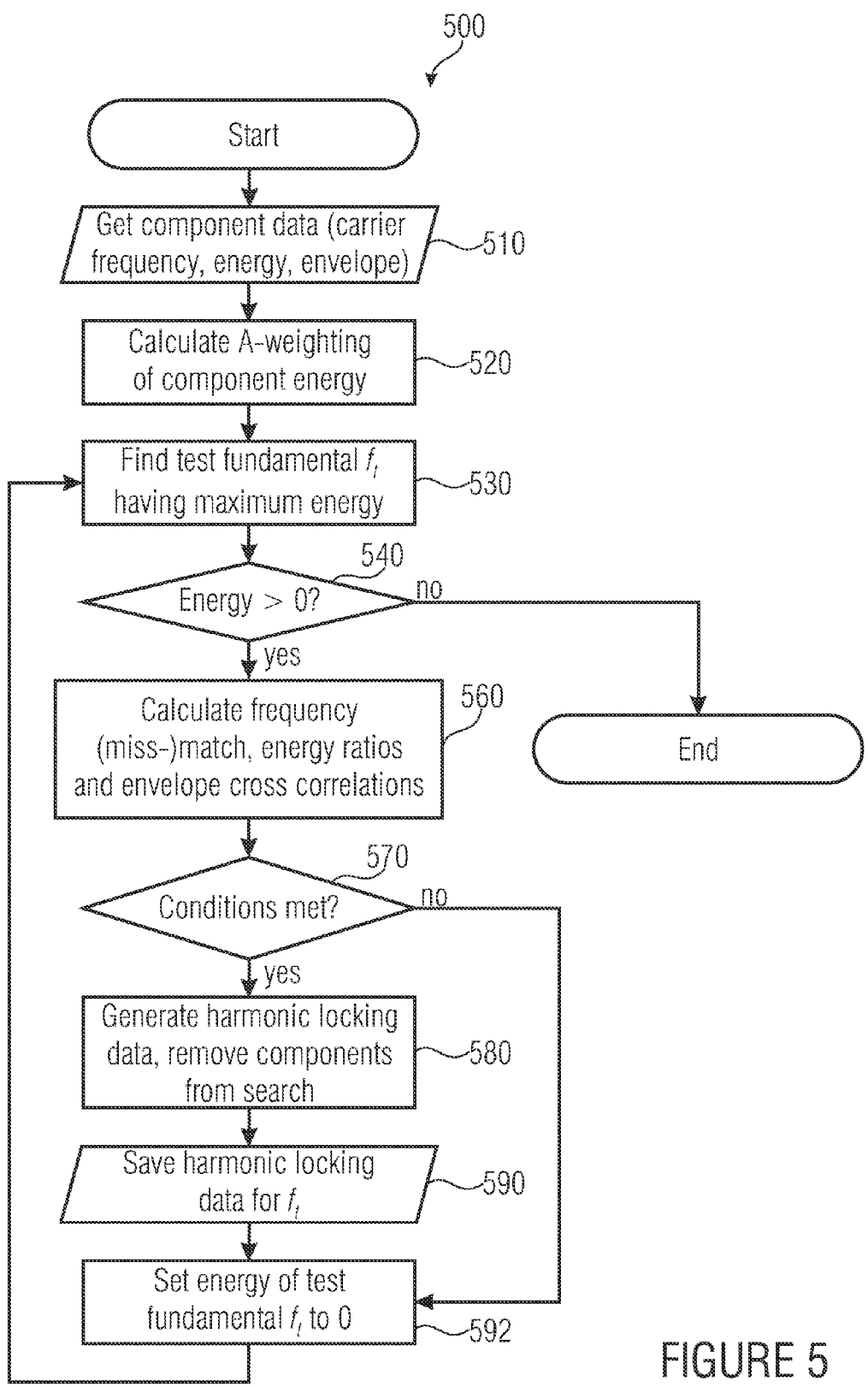
FIG. 5 is flow chart of a method for modifying an audio signal.

To achieve this, the simple processing scheme introduced before was extended by a harmonic locking functionality. The harmonic locking examines all MODVOC components prior to transposition whether a component (bandpass signal) is to be attributed to a fundamental or is to be regarded as an independent entity. This may be performed by an iterative algorithm. The flowchart of this algorithm is depicted in FIG. 5. The algorithm evaluates 510 frequency ratios, energy ratios and envelope cross correlations of a test component t (fundamental bandpass signal) with respect to all other components (bandpass signals) indexed by i E [0 . . . I−1]\t with I denoting the total number of components (number of bandpass signals of the plurality of bandpass signals). The succession of test components (fundamental bandpass signal) during the iteration is determined by their A-weighted energy 520 such that the evaluation order is in sequence of decreasing energy. The A-weighting (ANSI, "Ansi standard sl.4-1983," 1983.), (ANSI, "Ansi standard sl.42-2001," 2001.) is applied to model the perceptual prominente of each component in terms of its loudness (see for example "H. Fletcher and W. A. Munson, "Loudness, its definition, measurement and calculation," J. Acoust Soc Amer., vol. 5, pp. 82-108, 1933.").

A harmonic carrier frequency match, a harmonic carrier frequency mismatch, a component energy and/or a normalized amplitude envelope correlation at zero-lag may be examined by thresholding.

The frequency match and missmatch may be defined according to Equation 8 with $f_t$ being the test component carrier frequency (carrier frequency of the selected fundamental bandpass signal) and $f_i$ being the component with index i (a bandpass signal of the plurality of bandpass signals). For the frequency match, all multiples greater than 1 are potential harmonics. A suitable threshold value (carrier frequency threshold) for the frequency missmatch allowable for a potential harmonic is e.g. 22 Hz.

$$match_i = \text{round}\left(\frac{f_i}{f_t}\right) \quad (8)$$

$$missmatch_i = |f_i - (match_i \cdot f_t)|$$

The a-weighted component energy ratio (Equation 9) of harmonics versus fundamental may be smaller than a predefined threshold reflecting the fact that for the vast majority of instruments the harmonics exhibit lower energy than the fundamental. A suitable threshold value (energy tolerance range), for instance, is the ratio of 0.6.

$$nrgRatio_i = \frac{nrg_i}{nrg_t} \quad (9)$$

The normalized zero-lag cross correlation of the envelope of the test component $env_t$ and the envelope $env_i$ of the component with index i is defined by Equation 10. This measure exploits the fact that a fundamental and its harmonics share a rather similar temporal envelope within the block length M. A suitable threshold value (correlation threshold) was determined to be 0.4 by informal experiments.

$$xcorr_i = \frac{\sum_{m=0}^{M-1} env_i(m) \cdot env_t(m)}{\sqrt{\sum_{m=0}^{M-1} env_i^2(m) \sum_{m=0}^{M-1} env_t^2(m)}} \quad (10)$$

After being examined, all components i that meet 570 all of the threshold conditions are labeled 580 as harmonics to be locked with respect to the test component and are subsequently removed from the search. Next, the test component is also excluded from further iterations by settings 542 its energy to zero. The algorithm is repeated until all components have been assigned which is indicated by the maximum component energy being zero.

Figure 4:
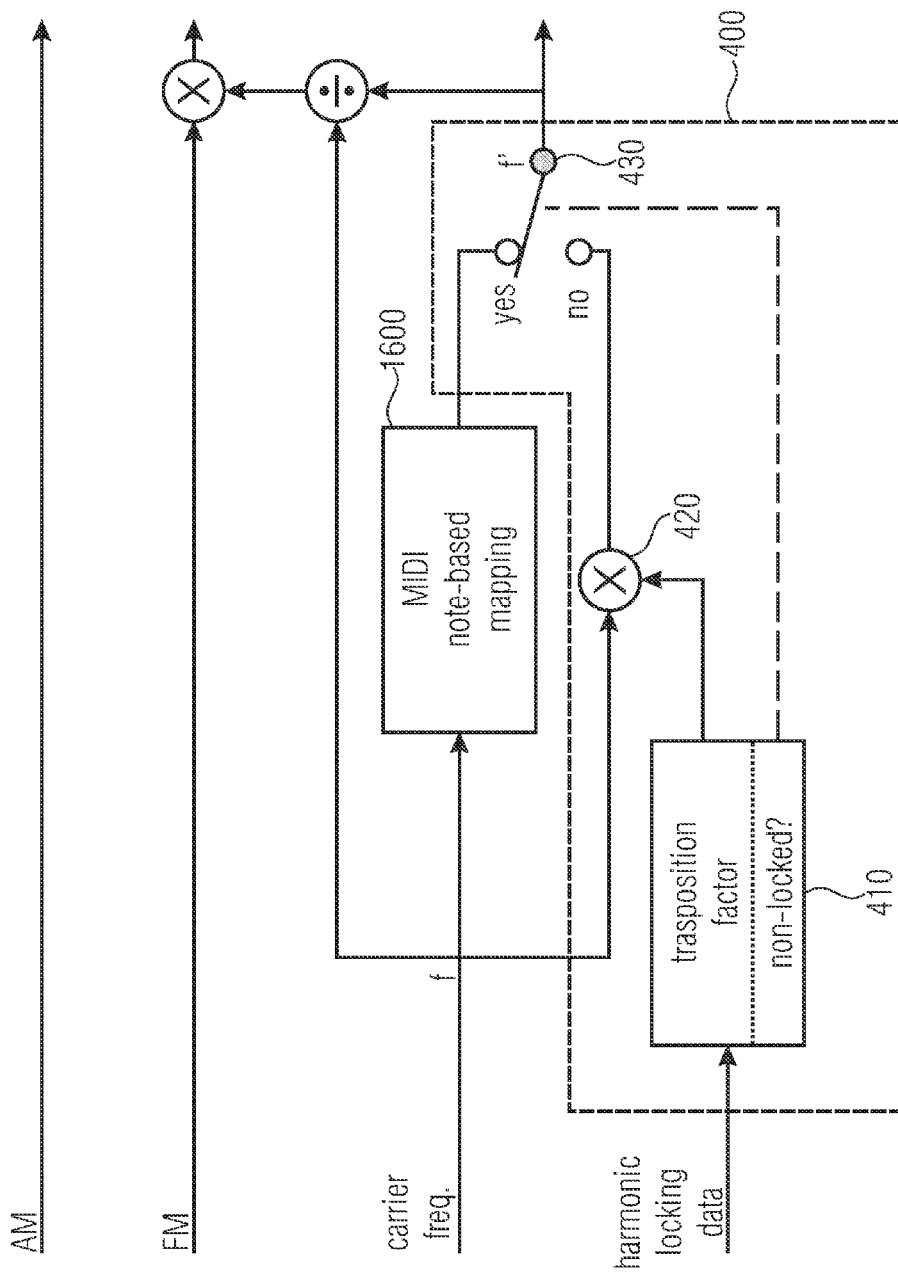
FIG. 4 is a block diagram of a part of a modulation vocoder using harmonic locking.

FIG. 4 shows the enhanced processing scheme of selective transposition by the MODVOC incorporating harmonic locking. As opposed to FIG. 16, only non-locked components enter the transposition stage while locked components are modified in a second stage by the same transposition factor that has been applied to their attributed fundamentals.

In other words, FIG. 5 shows a flow chart of the described harmonic locking (method 500 for modifying an audio signal). Components that match the conditions of being harmonics of a test fundamental (selected fundamental bandpass signal) are iteratively labeled and removed from search space. For this, each bandpass signal of the plurality of bandpass signals comprises a carrier frequency, an energy content, and a temporal envelope or the carrier frequency, the energy content and/or the temporal envelope (temporal envelope parameters) are determined 510 for each bandpass signal of the plurality of bandpass signals. Further, the energy content (energy content parameter) of each bandpass signal is a-weighted 520. Then, a fundamental bandpass signal (test fundamental $f_t$) comprising a maximum energy (energy content parameter) is selected 530. Since all already selected fundamental bandpass signals are set to zero and all identified overtone bandpass signals are excluded from search space, the selected fundamental bandpass signal may comprise an energy content parameter equal to zero, so that the iterative algorithms stops 540 at this point. Otherwise, the frequency match (or mismatch), the energy content and/or the temporal envelope cross correlation of the selected fundamental bandpass signal and the remaining bandpass signals of the plurality of bandpass signals are compared 560. If one, some or all conditions (overtone criterions) are met 570, the respective bandpass signal is identified 580 as overtone bandpass signal and harmonic locking data may be generated (e.g. storing an index of the identified bandpass signal in a list of overtones) as well as the identified overtone bandpass signal is removed from search space. The harmonic locking data may be saved 590 with reference to the associated selected fundamental bandpass signal. After identifying all overtone bandpass signals of the selected fundamental bandpass signal, the energy (the energy content parameter) of the selected fundamental bandpass signal is set 592 to zero and the next fundamental bandpass signal comprising the highest energy is selected 530.

The signal processor may use the harmonic locking data for modifying the bandpass signals. A possible implementation is shown in FIG. 4. In this implementation, for example, the signal processor comprises an MIDI mapper 1600 and an overtone modifier 400. The MIDI mapper 1600 may modify the carrier frequency of each selected fundamental bandpass signal according to the individual modification target (which may also include that a fundamental bandpass signal is not modified). The MIDI mapper 1600 may be implemented, for example, as shown and described in FIG. 16. The overtone modifier 400 may comprise an overtone modification controller 410, an overtone multiplier 420 and an overtone modification provider 430. The overtone modification controller 410 may be connected to the overtone multiplier 420 and the overtone modification provider 430 and the overtone multiplier 420 may be connected to the overtone modification provider 430. The overtone multiplier 420 may multiply the carrier frequency f of an identified overtone bandpass signal with the same transposition factor (with tolerance mentioned above) the associated fundamental bandpass signal is multiplied with, and may provide the modified carrier frequency f' to the overtone modification provider 430. The overtone modification controller 410 may trigger the overtone modification provider 430 to provide the modified carrier frequency of the identified overtone bandpass signal, if the overtone modifier 400 identifies the carrier frequency as a carrier frequency of an identified overtone bandpass signal (e.g., based on the harmonic locking data). Otherwise, the overtone modification provider 430 may provide the output of the MIDI mapper 1600. Further, FIG. 4 shows an implementation of the proposed concept in a vocoder, so that additionally to the carrier frequency of the bandpass signal also the corresponding frequency modulation signal (FM) is modified by a multiplication with a ratio of the carrier frequency before modification and the modified carrier frequency. Alternatively, to a frequency modification or, additionally, to a frequency modification, the loudness of the audio signal may be bandpass-signal-selectively modified. For this, the amplitude modulation signal (AM) of a bandpass signal may be modified.

In other words, FIG. 4 shows an enhanced selective transposition on modulation vocoder components (bandpass signals) using harmonic locking (modifying identified overtone bandpass signals depending on the modification of the associated fundamental bandpass signal). Only non-locked carrier frequencies (which may then be fundamental bandpass signals) are quantized to MIDI notes which are mapped onto appropriate corresponding MIDI notes (according to the individual modification target). Locked components (identified overtone bandpass signals) may be transposed by multiplication by the ratio of original and modified carrier frequency of the attributed fundamental (associated fundamental bandpass).

Figure 6A:
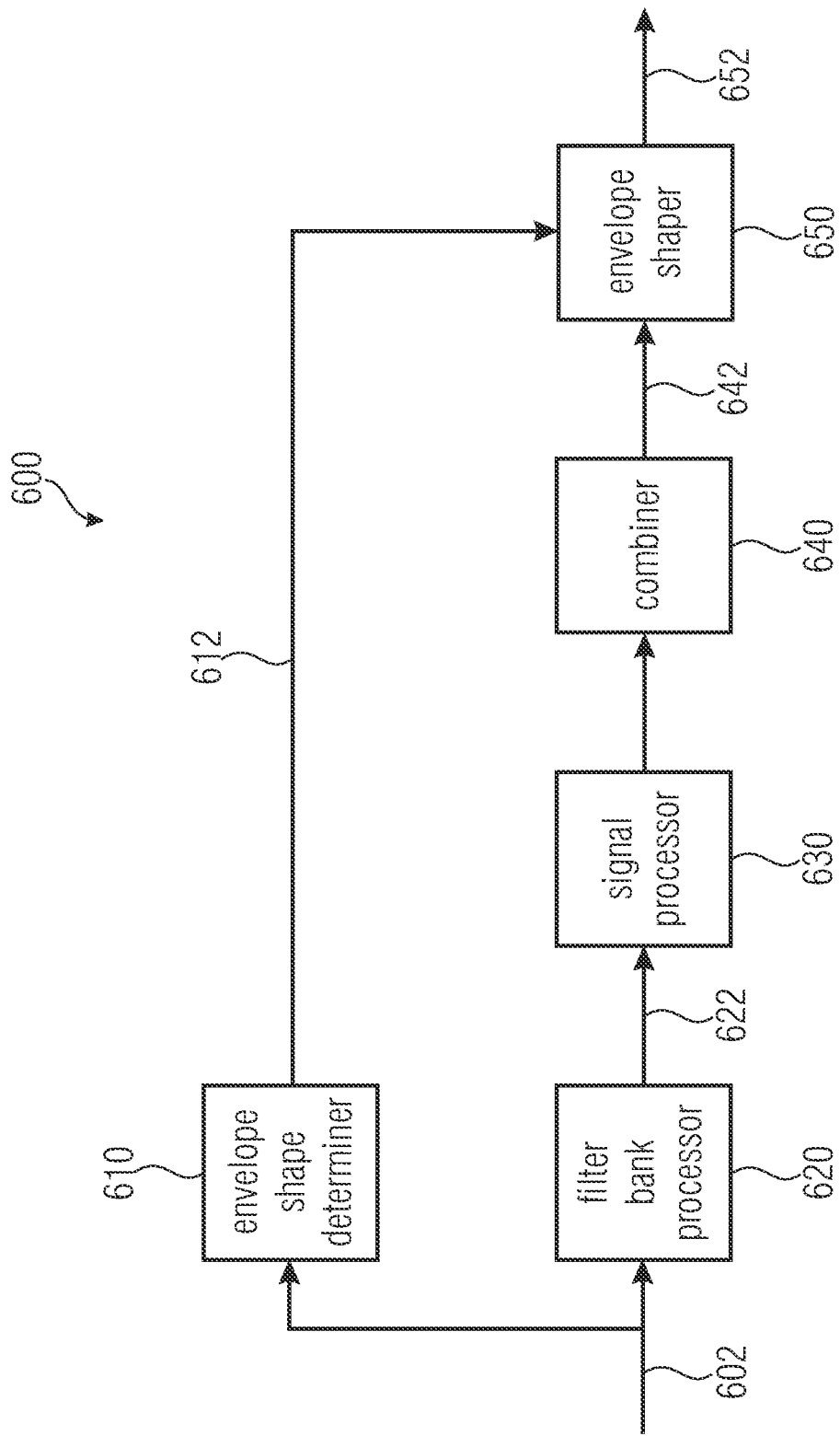
FIG. 6a, 6b, 6c, 6d is a block diagram of an apparatus for modifying an audio signal.

FIG. 6a shows a block diagram of an apparatus 600 for modifying an audio signal according to an embodiment of the invention. The apparatus 600 comprises an envelope shape determiner 610, a filter bank processor 620, a signal processor 630, a combiner 640 and an envelope shaper 650. The envelope shape determiner 610 is connected to the envelope shaper 650, the filter bank processor 620 is connected to the signal processor 630, the signal processor 630 is connected to the combiner 640 and the combiner 640 is connected to the envelope shaper 650. The envelope shape determiner 610 determines envelope shape coefficients 612 based on a frequency domain audio signal 602 representing a time domain input audio signal. Further, the filter bank processor 620 generates a plurality of bandpass signals 622 in a subband domain based on the frequency domain audio signal 602. The signal processor 630 modifies a subband domain bandpass signal 622 of the plurality of subband domain bandpass signals based on a predefined modification target. Further, the combiner 640 combines at least a subset of the plurality of subband domain bandpass signal (e.g. containing the modified subband domain bandpass signal) to obtain a time domain audio signal 642. The envelope shaper 650 shapes an envelope of the time domain audio signal 642 based on the envelope shape coefficients 612 to obtain a shaped audio signal 652.

Alternatively, the envelope shaper 650 may be located between the signal processor 630 and the combiner 640 (the signal processor 630 is connected to the envelope shaper 650 and the envelope shaper 650 is connected to the combiner 640) and may shape an envelope of the plurality of subband domain bandpass signals containing the modified subband domain bandpass signal based on the envelope shape coefficients 612.

By extracting envelope shape coefficients 612 before the audio signal is processed bandpass signal selectively and by using the envelope shape coefficients 612 to shape the envelope of the audio signal after modifying one or more bandpass signals, the spectral coherence of the differently modified bandpass signals can be preserved more accurately. Further, especially for transient signals a quantization noise spread over time may be shaped by the envelope shaper 650 as well. In this way, the perceptual quality of the modified audio signal may be improved significantly. Further, the audio signal can be modified in real time, since an a-priori information about the whole audio signal (e.g. the whole polyphonic music title) may not be necessary.

Further alternatively, the envelope shaper 650 may be located between the signal processor 630 and the filter bank processor 620 (the filter bank processor 620 is connected to the envelope shaper 650 and the envelope shaper 650 is connected to the signal processor 630) and may shape an envelope of the plurality of subband domain bandpass signals based on the envelope shape coefficients 612 before a subband domain bandpass signal is modified by the signal processor 630 to obtain a shaped audio signal 652.

By extracting envelope shape coefficients 612 before the audio signal is processed bandpass signal selectively and by using the envelope shape coefficients 612 to shape the envelope of the plurality of bandpass signals 622 after the plurality of bandpass signals 622 is generated by the filter bank processor 620 in the subband domain, an adaptive filter bank can be implemented, which may increase the local coherence especially for transient signals (see for example "J. Herre and J. D. Johnston, "A continuously signal-adaptive filterbank for high-quality perceptual audio coding," IEEE ASSP Workshop on Applications of Signal Processing to Audio and Acoustics, Mohonk, 1997."). In this case, not the modified signal (or the modified bandpass signal) is shaped, but the quality of the generated bandpass signals in terms of transients reproduction may be increased before the modification.

The frequency domain audio signal 602 may be provided, for example, from a preprocessor generating the frequency domain audio signal 602 based on a time domain input audio signal (e.g., by a discrete Fourier transform) or may be provided from a storage unit. The envelope shape coefficients 612 determined by the envelope shaped determiner 610 may be, for example, linear predication coefficients or other coefficients parameterising the spectrum of the frequency domain audio signal 602.

The signal processor 630 may modify one, some or all subband domain bandpass signals 622 of the plurality of subband domain bandpass signals. The predefined modification target may be different, for example, for all or for some subband domain bandpass signals. For example, for changing a key mode of the audio signal, the predefined modification targets of the subband domain bandpass signals may be defined as already mentioned in connection with the table above.

The frequency domain audio signal 602 may comprise spectral lines obtained, for example, by Fourier transform. The difference between spectral lines of the frequency domain audio signal (which can also be assumed as bandpass signals) and a bandpass signal generated by the filterbank processor 620 may be that a spectral line of the frequency domain audio signal 602 represents a bandwidth narrower than a bandwidth represented by a subband domain bandpass signal 622 generated by the filter bank processor 620. For example, the frequency domain audio signal 602 indicates a frequency spectrum obtained by a discrete Fourier transform, which is divided into the plurality of bandpass signals by the filter bank processor 620, wherein a number of bandpass signals (e.g. 10, 16, 20 or more) of the plurality of bandpass signals is significantly lower than a number of spectral values or spectral lines of the frequency spectrum (e.g. 512 or more spectral values).

The enveloped shaped determiner 610 may determine the envelope shape coefficients based on a prediction over frequency of the frequency domain audio signal 602, which may be realized, for example, as already mentioned by a determination of linear prediction coefficients.

Figure 7:
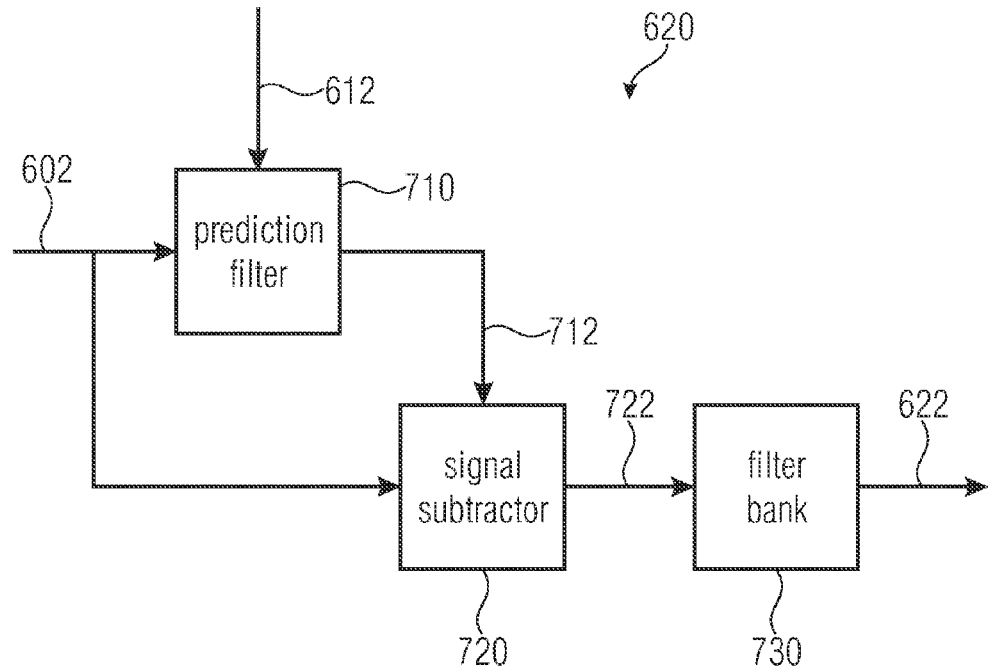
FIG. 7 is a block diagram of a filter bank processor.

The filter bank processor 620 may provide the plurality of bandpass signals, each bandpass signal 622 representing a specific frequency range of the frequency domain audio signal 602. Alternatively, the filter bank processor 620 may comprise a prediction filter 710, a signal subtractor 720 and a filter bank 730 to obtain the plurality of bandpass signals 622 based on a residual audio signal 722 as shown in FIG. 7. For this, the prediction filter 710 may generate a prediction audio signal 712 based on a frequency domain audio signal 602 and the envelope shape coefficients 612 (e.g., linear prediction filter). Further, the signal subtractor 720 may subtract the prediction audio signal 712 from the frequency domain audio signal 602 to obtain a residual audio signal 722. This residual audio signal 722 may be used by the filter bank 730 to generate bandpass signals to obtain the plurality of bandpass signals.

Further, the filter bank processor 620 may comprise an optional signal converter. This signal converter (e.g., single sided inverse discrete Fourier transformer) may convert the bandpass signals generated by the filter bank 730 to the subband domain to obtain the plurality of bandpass signals 622. Alternatively, the signal converter may also be part of the signal processor 630.

Figure 6B:
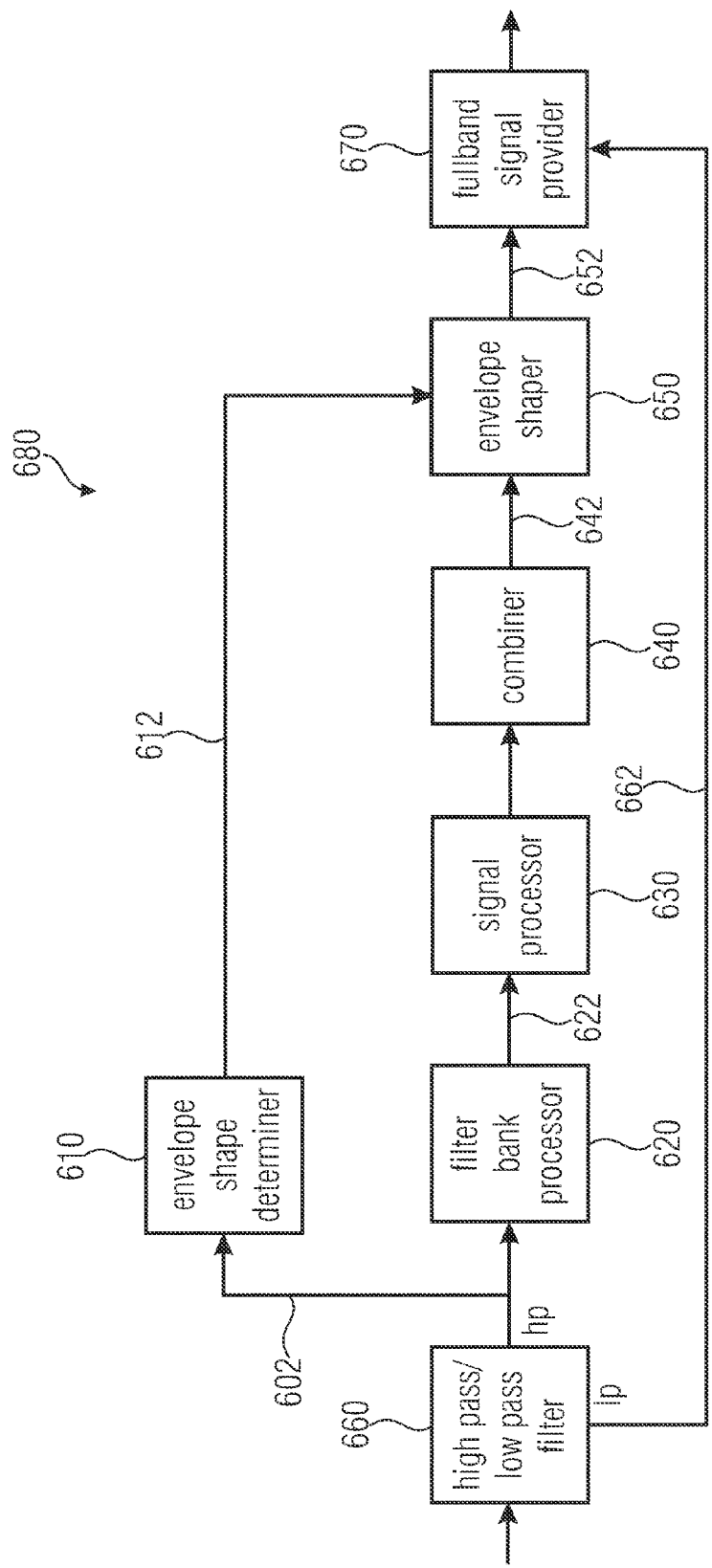

In some embodiments according to the invention, a low frequency part of the input audio signal may be excluded from a possible modification to avoid an generation of artifacts in the low frequency part of the modified audio signal. For this, an apparatus 680 for modifying an audio signal may comprise a high pass/low pass filter, as for example shown in FIG. 6*b*. The high pass/low pass filter 660 high pass filters the time domain input audio signal or the frequency domain audio signal representing the time domain input audio signal, so that the envelope shape determiner 610 determines the envelope shape coefficients 612 based on the high pass frequency domain audio signal 602 and the filterbank processor 620 generates the plurality of bandpass signals 622 in a subband domain based on the high pass frequency domain audio signal 602. Further, the high pass/low pass filter 660 low pass filters the time domain input audio signal or the frequency domain audio signal representing the time domain input audio signal to obtain a low pass audio signal 662. Further, the apparatus 680 comprises a fullband signal provider 670 configured to combine the shaped audio signal 652 and the low pass audio signal 662 to obtain a fullband audio signal. In other words, the high pass/low pass filter 660 may separate the time domain input audio signal or the frequency domain audio signal representing the time domain input audio signal into a high pass audio signal and a low pass audio signal. The high pass audio signal or a frequency domain representation of the high pass audio signal may be provided to the envelope shape determiner 610 and the filter bank processor 620. This depends on whether the high pass/low pass filter is implemented in the time domain followed by a signal preprocessor generating the frequency domain audio signal based on the high pass audio signal or the high pass/low pass filter is implemented in the frequency domain receiving already a frequency domain audio signal representing the time domain input audio signal.

The high pass/low pass filter 660 may filter the time domain input audio signal or the frequency domain audio signal representing the time domain input audio signal, so that the low pass audio signal contains frequencies up to a predefined threshold frequency (e.g. 100 Hz or more). Consequently, the high pass audio signal may comprise frequencies down to the predefined threshold frequency. In other words, frequencies larger than the predefined threshold frequency may be attenuated by the high pass/low pass filter 660 for providing the low pass audio signal 662 and frequencies lower than the predefined threshold frequency may be attenuated by the high pass/low pass filter 660 for providing the high pass signal.

Figure 6C:
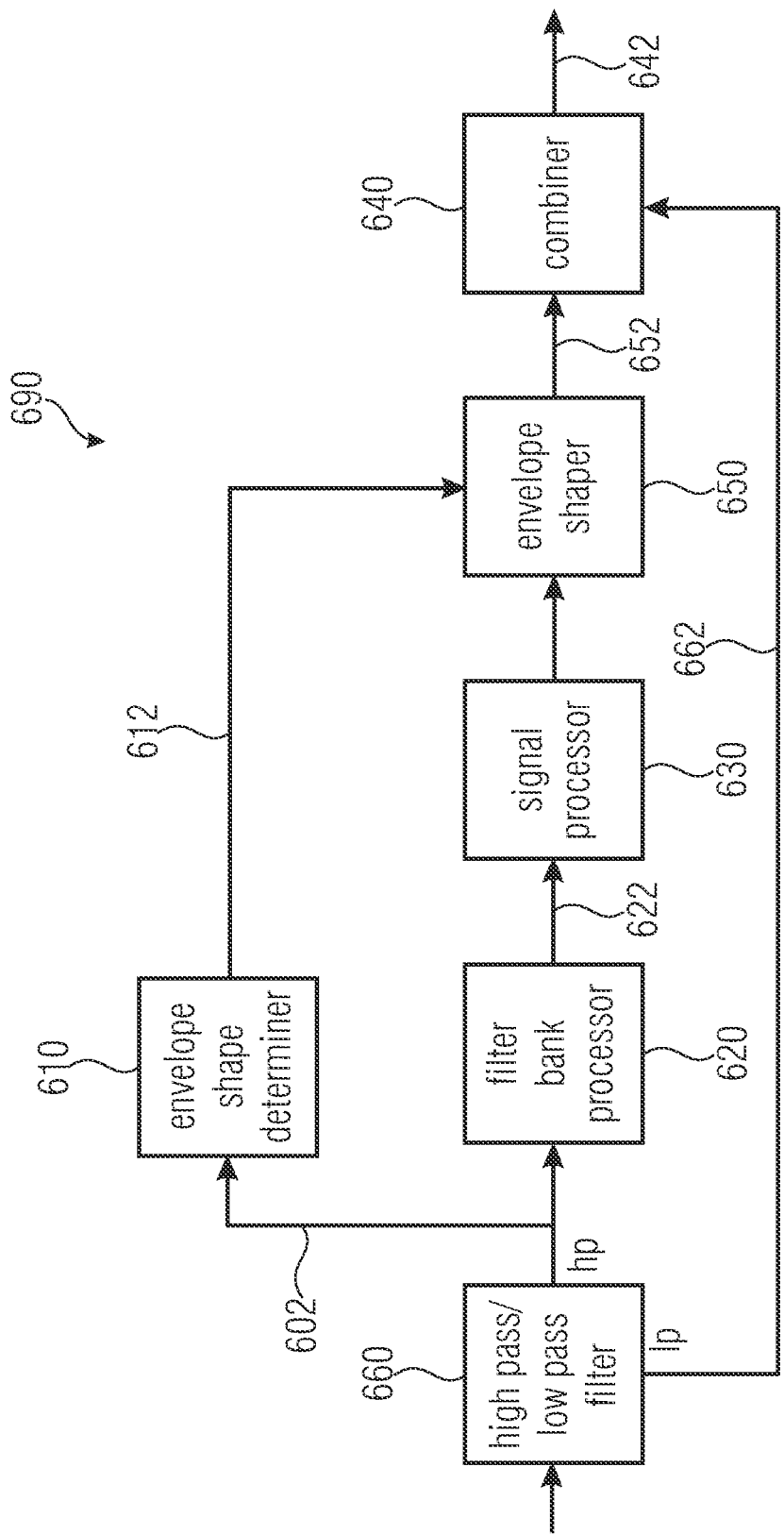

Alternatively, the envelope shaper 650 is located between the signal processor 630 and the combiner 640 as shown in FIG. 6*c*. In this case, the high pass/low pass filter 660 provides the low pass audio signal to the combiner 640. The combiner 640 combines the plurality of subband domain bandpass signals containing the modified subband domain bandpass signal and the low pass audio signal 662 to obtain a time domain audio signal 642. In this case, the envelope shaper 650 may determine a set of bandpass envelope shape coefficients based on the envelope shape coefficients 612 (e.g. by the coefficient converter 810) for each subband domain bandpass signal corresponding to the respective subband domain bandpass signal (e.g. corresponding to the frequency region contained by the respective subband domain bandpass signal). Then, for example, each time sample of a subband domain bandpass signal can be multiplied with an bandpass envelope shape coefficient of the corresponding set of envelope shape coefficients. For example, in the vocoder implementation shown in FIG. 15, the envelope shaper 650 may be located between the multiplier 1550 and the combiner 1560.

Further alternatively, the envelope shaper 650 may be located between the signal processor 630 and the filter bank processor 620 (the filter bank processor 620 is connected to the envelope shaper 650 and the envelope shaper 650 is connected to the signal processor 630) and may shape an envelope of the plurality of subband domain bandpass signals based on the envelope shape coefficients 612 before a subband domain bandpass signal is modified by the signal processor 630 to obtain a shaped audio signal 652.

Figure 6D:
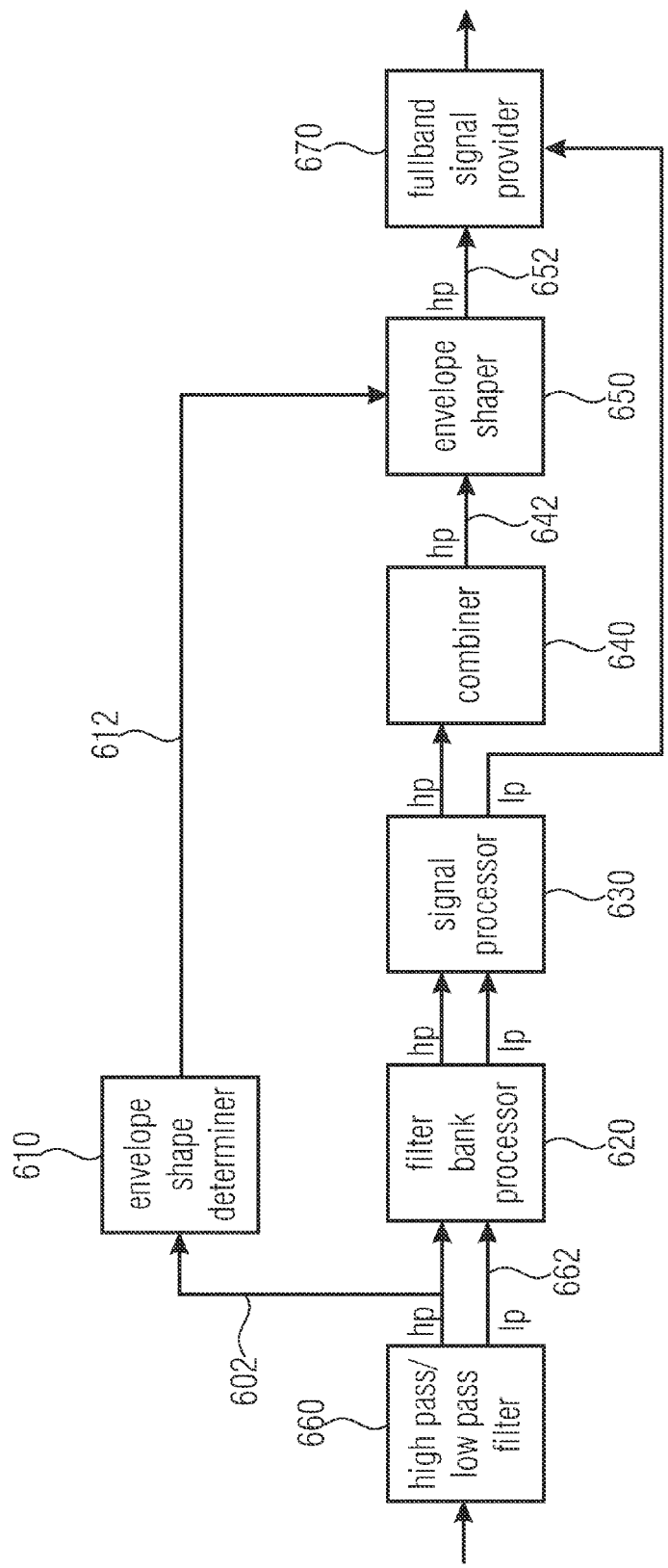

In some embodiments according to the invention, a low frequency part of the input audio signal may be excluded from envelope shaping to avoid an generation of artifacts in the low frequency part of the modified audio signal. For this, an apparatus 680 for modifying an audio signal may comprise a high pass/low pass filter, as for example shown in FIG. 6*d*. The high pass/low pass filter 660 high pass filters the time domain input audio signal or the frequency domain audio signal representing the time domain input audio signal. Further, the high pass/low pass filter 660 low pass filters the time domain input audio signal or the frequency domain audio signal representing the time domain input audio signal to obtain a low pass audio signal 662. The envelope shape determiner 610 determines the envelope shape coefficients 612 based on the high pass frequency domain audio signal 602 without considering the low pass audio signal 622. The filterbank processor 620 generates the plurality of bandpass signals 622 in a subband domain based on the high pass frequency domain audio signal 602 and the low pass audio signal 622. If a prediction filter is used, as for example shown in FIG. 7, only the high pass frequency domain audio signal 602 is provided to the prediction filter and the signal subtractor to generate a high pass residual audio signal. The low pass audio signal 622 may be provided directly to the filter bank for generating subband domain bandpass signals. The signal processor 630 may modify a subband domain bandpass signal corresponding to the high pass frequency domain audio signal 602 or the low pass audio signal 622. Alternatively, the signal processor 630 may modify a subband domain bandpass signal corresponding to the high pass frequency domain audio signal 602 and a subband domain bandpass signal corresponding to the low pass audio signal 622. The combiner 640 may combine only the subband domain bandpass signal corresponding to the high pass frequency domain audio signal 602, so that only the subband domain bandpass signals corresponding to the high pass frequency domain audio signal 602 (and not the subband domain bandpass signals corresponding to the low pass audio signal 622) may be shaped by the envelope shaper 650.

Further, the apparatus 680 comprises a fullband signal provider 670 configured to combine the shaped audio signal 652 and the subband domain bandpass signals corresponding to the low pass audio signal 662 to obtain a fullband audio signal. For this, the signal processor 630 may provide the subband domain bandpass signals corresponding to the low pass audio signal 662 to the fullband signal provider 670.

Alternatively, the envelope shaper 650 is located between the signal processor 630 and the combiner 640. In this case, the signal processor 630 may provide the subband domain bandpass signals corresponding to the low pass audio signal 662 to the combiner 640. The combiner 640 combines the plurality of subband domain bandpass signals (the subband domain bandpass signals corresponding to the low pass audio signal 662 and the subband domain bandpass signals corresponding to the high pass frequency domain audio signal 602) containing the modified subband domain bandpass signal to obtain a time domain audio signal 642. In this case, the envelope shaper 650 may determine a set of bandpass envelope shape coefficients based on the envelope shape coefficients 612 (e.g. by the coefficient converter 810) for each subband domain bandpass signal corresponding to the respective subband domain bandpass signal (e.g. corresponding to the frequency region contained by the respective subband domain bandpass signal) of the subband domain bandpass signals corresponding to the high pass frequency domain audio signal 602. Then, for example, each time sample of a subband domain bandpass signal can be multiplied with an bandpass envelope shape coefficient of the corresponding set of envelope shape coefficients. For example, in the vocoder implementation shown in FIG. 15, the envelope shaper 650 may be located between the multiplier 1550 and the combiner 1560.

Further alternatively, the envelope shaper 650 may be located between the signal processor 630 and the filter bank processor 620 (the filter bank processor 620 is connected to the envelope shaper 650 and the envelope shaper 650 is connected to the signal processor 630) and may shape an envelope of the subband domain bandpass signals corresponding to the high pass frequency domain audio signal 602 based on the envelope shape coefficients 612 before a subband domain bandpass signal is modified by the signal processor 630 to obtain a shaped audio signal 652.

In this way, a low frequency portion of the input audio signal may be exempted from the envelope shaping. However, the low frequency portion is routed to the remaining processing (e.g. modification of a subband domain bandpass signal). Further, a prediction filter (e.g. as shown in FIG. 7) may only be applied above the predefined threshold frequency. Alternatively, if the high pass/low pass separation is already performed at the analysis side, the high pass signal envelope may be modified in the time domain by a reciprocal of the envelope shape coefficients.

For example, in applications for selective transposition, the shown placement may provide equivalent results as a placement after the processing, since the AM may not be modified.

According to an aspect, the envelope shaper 650 may determine an energy ratio of an energy content $E_{FDAS}$ of the frequency domain audio signal 602 and an energy content $E_{RAS}$ of the residual audio signal 722. Based on this energy ratio, the envelope shaper 650 may interrupt shaping of the envelope of the time domain audio signal 642, if the energy ratio is lower than a predefined energy threshold PET (0.1, 0.2, 0.5, 0.8, 1, 2 or ever more or less).

$$PET = \frac{E_{FDAS}}{E_{RAS}}$$

In other words, the engagement of the envelope shaping may be switched on or off signal adaptively depending on the goodness of the prediction. The goodness of the prediction may be measured by the prediction gain which may be defined to be the energy ratio of signal (frequency domain audio signal) and prediction error (residual audio signal). If the shaping of the envelope of the time domain audio signal 642 is interrupted, the shaped audio signal 652 may be equal to the time domain audio signal 642 provided by the combiner 640.

Figure 8:
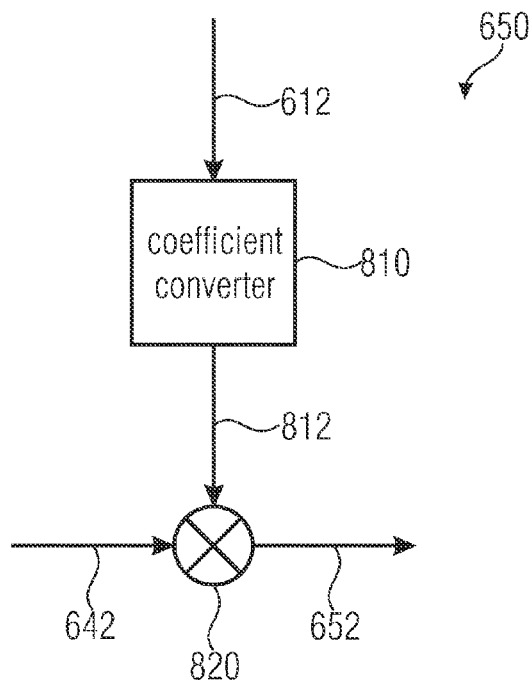
FIG. 8 is a block diagram of an envelope shaper.

The envelope shaper 650 may be implemented in various ways. One example is shown in FIG. 8. The envelope shaper 650 may comprise a coefficient converter 810 and a multiplier 820. The coefficient converter 810 may convert the envelope shape coefficients 612 to the time domain, so that the converted envelope shape coefficients 812 can be multiplied with the time domain audio signal 642 to shape the temporal envelope of the time domain audio signal and to obtain the shaped audio signal 652. This may be done by the multiplier 820. For example, a time block of the time domain audio signal 642 may contain 512 (or more) time samples and the coefficient converter 810 may provide 512 (or more) converted envelope shape coefficients 812 for multiplying each time sample with a converted envelope shape coefficient. 812.

As already mentioned, the apparatus 600 may modify different subbands domain bandpass signals differently. More generally, this means that the signal processor 630 may modify a second or further subband domain bandpass signal 622 of the plurality of subband domain bandpass signals based on a second or further predefined modification target. The already mentioned or first predefined modification target and the further or second predefined modification target may be different.

In some embodiments, the described concept may be used in connection with vocoders or modulation vocoders. In this case, the signal processor 630 may generate an amplitude modulation signal (AM) and a frequency modulation signal (FM) for each subband domain bandpass signals 622 of the plurality of subband domain bandpass signals. Further, the signal processor 630 may modify the amplitude modulation signal or the frequency modulation signal of the subband domain bandpass signal to be modified based on the predefined modification target.

Further, the apparatus 600 may comprise optionally a carrier frequency determiner as already described for apparatus 200 and shown in FIG. 2. The carrier frequency determiner may determine a plurality of carrier frequencies based on the frequency domain audio signal 602. These determined carrier frequencies may be used by the filter bank processor 620 or in the implementation shown in FIG. 7 by the filter bank 730 of the filter bank processor 620 to generate subband domain bandpass signals, so that each subdomain bandpass signal comprises a frequency range containing a different carrier frequency of the plurality of carrier frequencies to obtain a subband domain bandpass signal associated to each carrier frequency of the plurality of carrier frequencies. This may be done, for example, by determining center of gravities of the frequency domain audio signal as mentioned above.

The envelope shaped determiner 610, the filter bank processor 620, the signal processor 630, the combiner 640 and/or the envelope shaper 650 may be, for example, individual hardware units or part of a digital signal processor, a computer or micro controller as well as a computer program or software product configured to run on a digital signal processor, computer or micro controller.

Some embodiments according to the invention relate to an implementation of the described concept in a modulation vocoder. For this example, the concept is described in more detail in the following. The mentioned features can be used also in other implementations or applications.

It has been stated before that the MODVOC processing preserves spectral coherence in the bandpass area surrounding the carrier locations. However, the broadband global spectral coherence is not preserved. For quasi-stationary signals this may have only minor impact on the perceptual quality of the synthesized signal. If the signal contains prominent transients like e.g. drum beats or castanets, the preservation of global coherence can greatly improve the reproduction quality of these signals.

The preservation of global coherence can be improved by linear prediction in the spectral domain. Some approaches are utilized in audio codecs, for instance by the temporal noise shaping (TNS) tool (see for example "J. Herre and J. D. Johnston, "Enhancing the performance of perceptual audio coders by using temporal noise shaping (tns)," 101st AES convention, Los Angeles, no. Preprint 4384, 1996.") in MPEG 2/4 advanced audio coding (AAC). In "J. Herre and J. D. Johnston, "A continuously signal-adaptive filterbank for high-quality perceptual audio coding," IEEE ASSP Workshop on Applications of Signal Processing to Audio and Acoustics, Mohonk, 1997.", the combination of a high resolution time-frequency transform and spectral prediction is shown to essentially correspond to a signal adaptive transform.

Figure 9:
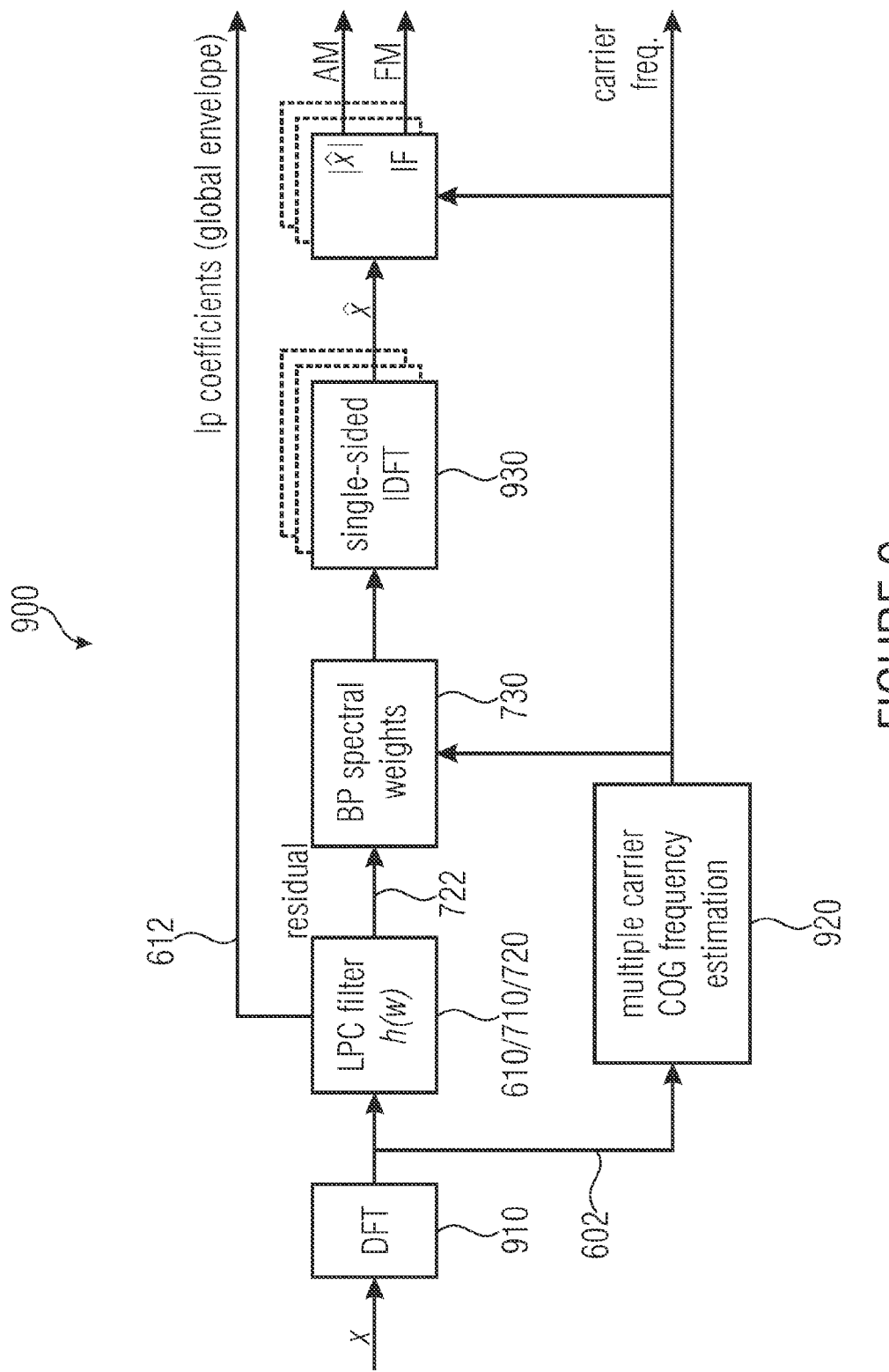
FIG. 9 is a schematic illustration of a modulation analysis with envelope shaping.

FIG. 9 outlines the integration of the described concept into the MODVOC processing scheme. In the analysis, subsequent to the initial DFT of the input signal x, linear prediction coefficients (LPC) of a forward predictor along frequency having the impulse response h (w) are derived by e.g. the autocorrelation method minimizing the prediction error in a least squares sense. Subsequently, the filter is applied to the spectral values and the residual signal is further processed by the MODVOC algorithm. The filter coefficients, representing the global envelope, are conveyed to the synthesis stage. In the synthesis, the global envelope, derived by evaluation of the prediction filter on the unit circle $|H(e^{jx})|$, is restored by a multiplicative application of the same to the sum signal yielding the output signal y as illustrated in FIG. 10.

Figure 10:
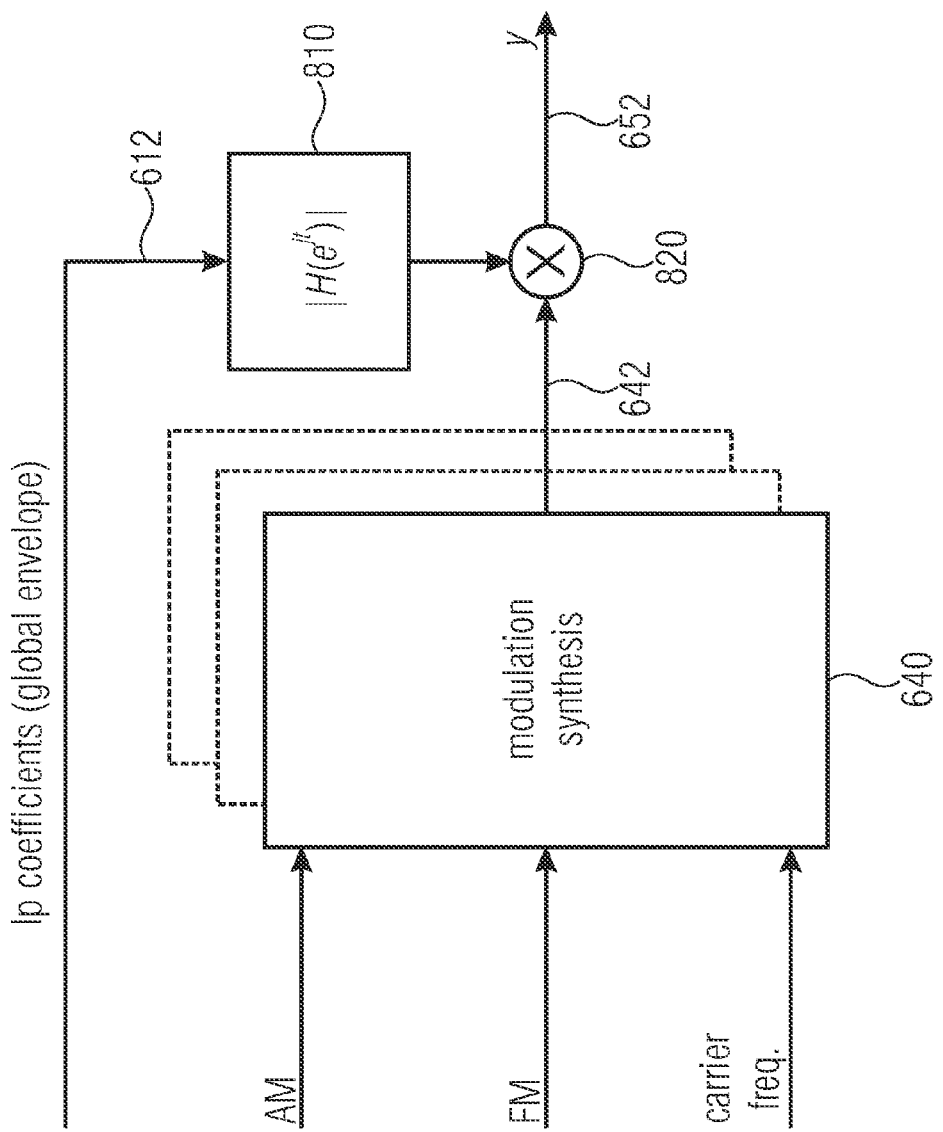
FIG. 10 is a schematic illustration of a modulation synthesis with envelope shaping.

In other words, FIGS. 9 and 10 show an implementation of the described concept in a modulation vocoder. FIG. 9 shows the modulation analyzer part comprising a preprocessor 910, which performs, for example, a discrete Fourier transform of a time domain audio signal to obtain a frequency domain audio signal 602 and provides the frequency domain audio signal 602 to the envelope shape determiner 610, the prediction filter 710 (e.g., LPC filter h (w)), the signal subtractor 710 and the carrier frequency determiner 920. The signal subtractor 720 may provide the residual audio signal 722 to the filter bank 730. The carrier frequency determiner 920 may estimate multiple carrier center of gravity frequencies and provide these carrier frequencies to the filter bank 730 for controlling the bandpass spectral weights. The filterbank 730 may provide the bandpass signals to a signal converter 930 performing a single sided inverse discrete Fourier transform for each bandpass signal to provide the plurality of subband domain bandpass signals to the signal processor. The components of the modulation vocoder are already described above in greater detail. Further FIG. 10 shows the synthesis part of the modulation vocoder. It comprises the combiner 640 and the envelope shaper comprising a coefficient converter 810 and a multiplier 820. Further details to the modulation vocoder components and the envelope shaper are already explained above.

Figure 11:
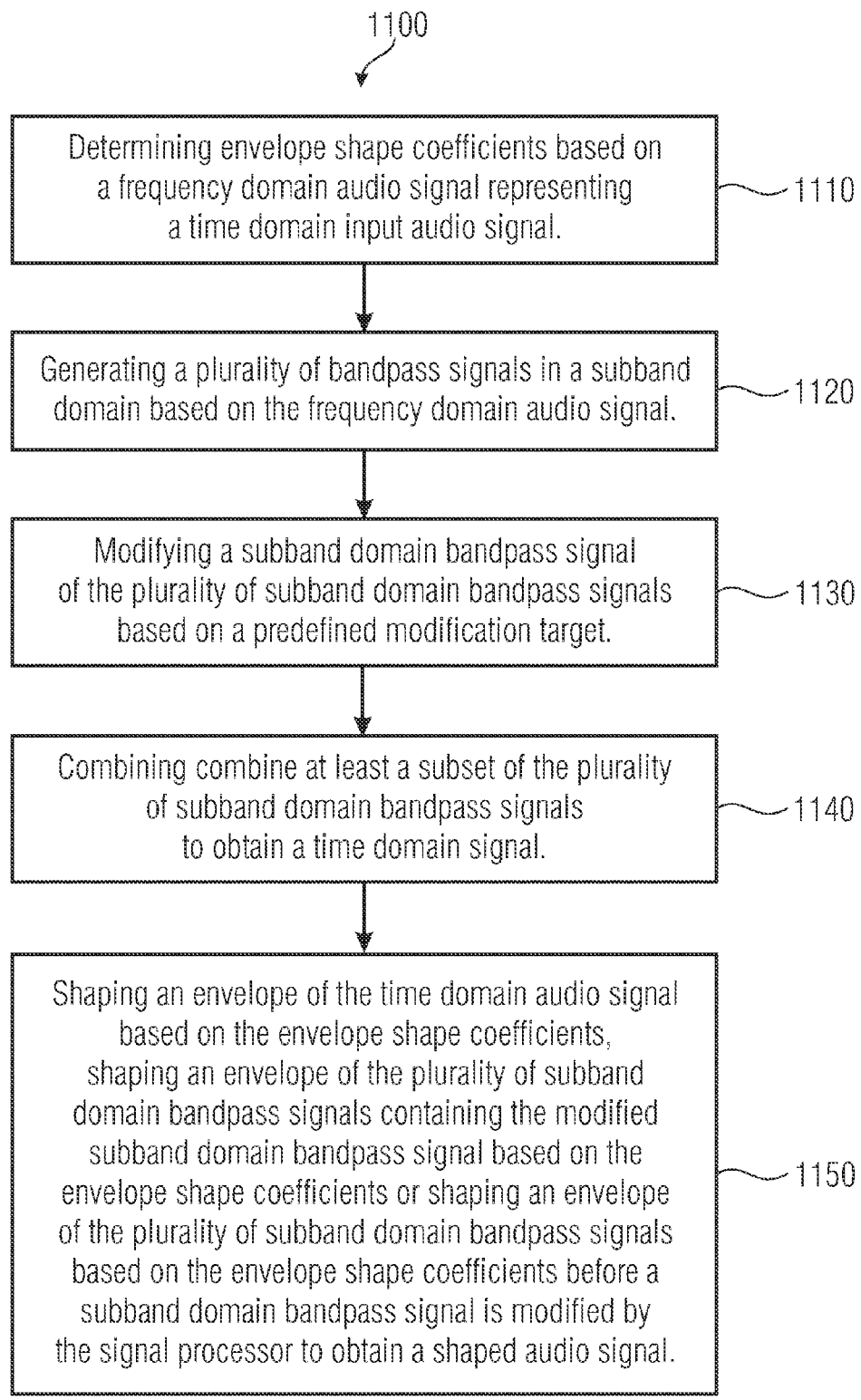
FIG. 11 is a flow chart of a method for modifying an audio signal.

FIG. 11 shows a flowchart of the method 1100 for modifying an audio signal according to an embodiment of the invention. The method 1100 comprises determining 1110 envelope shape coefficients based on a frequency domain audio signal representing a time domain input audio signal and generating 1120 a plurality of bandpass signals in a subband domain based on the frequency domain audio signal. Further, the method 1100 comprises modifying 1130 a subband domain bandpass signal of the plurality of subband domain bandpass signals based on a predefined modification target. Additionally, at least a subset of the plurality of subband domain bandpass signals is combined 1140 to obtain a time domain audio signal. Further, the method 110 comprises shaping 1150 an envelope of the time domain audio signal based on the envelope shape coefficients, shaping 1150 an envelope of the plurality of subband domain bandpass signals containing the modified subband domain bandpass signal based on the envelope shape coefficients or shaping 1150 an envelope of the plurality of subband domain bandpass signals based on the envelope shape coefficients before a subband domain bandpass signal is modified by the signal processor to obtain a shaped audio signal.

Optionally, the method 1100 may comprise further steps representing the features of the described concept mentioned above.

Some embodiments according to the invention relate to an apparatus for modifying an audio signal combining the features of the apparatus show in FIG. 1 or 2 with the features of the apparatus shown in FIG. 6. Fittingly, FIG. 12 shows a block diagram of an apparatus 1200 according to an embodiment of the invention.

Starting from the apparatus shown in FIG. 1, the apparatus 1200 comprises additionally an envelope shape determiner 610 and an envelope shaper 650. In this connection the audio signal may be a frequency domain audio signal representing a time domain input audio signal, which may be used by the envelope shape determiner to determine envelope shape coefficients based on the frequency domain audio signal. Further, the plurality of bandpass signals generated by the filter bank may be generated in a subband domain based on the frequency domain audio signal. After combining the plurality of subband domain bandpass signals containing the modified selected fundamental bandpass signal and the modified identified overtone bandpass signal, the obtained time domain audio signal 152, 642 may be provided to the envelope shaper 650. The envelope shaper 650 may shape an envelope of the time domain audio signal based on the envelope shape coefficients 612 to obtain the shaped audio signal 652.

Otherwise, starting from the apparatus shown in FIG. 6, the apparatus 1200 comprises additionally a fundamental determiner 120 and an overtone determiner 130 as described in connection with the apparatus shown in FIG. 1. The fundamental determiner 120 may select a subband domain bandpass signal of the plurality of subband domain bandpass signals to obtain the fundamental bandpass signals 122. Further, the overtone determiner 130 may identify a subband domain bandpass signal 112 of the plurality of subband domain bandpass signals fulfilling an overtone criterion regarding the selected fundamental bandpass signal 122 to obtain an overtone bandpass signal 132 associated to the selected fundamental bandpass signal 122. The signal processor 140, 630 may modify the selected fundamental bandpass signal based on a predefined modification target and modify an identified overtone bandpass signal 132 associated to the selected fundamental bandpass signal 122 depending on the modification of the selected fundamental bandpass signal 122 as mentioned above.

In this way, overtones of fundamentals and overtones may be treated equivalent during the modification of the audio signal and the spectral coherence of the plurality of bandpass signals may be preserved very accurate by shaping the modified time domain audio signal based on the envelope shape coefficients derived before the modification of the bandpass signals. In this way, the perceptual quality of the modified audio signal can be improved significantly.

The apparatus 1200 may realize further features of the different implementation examples mentioned above.

In the following, the improvement of the perceptual quality of the modified audio signals is shown by the results of listening tests. For this listening test a modulation vocoder (MODVOC) based implementation was used, but the results are also valid generally for the proposed concept.

In order to evaluate the subjective audio quality of the modulation vocoder (MODVOC) for the application of selective pitch transposition and, moreover, the merit of the proposed enhancements to the basic MODVOC principle, a set of exemplary audio files has been assembled and processed accordingly. Additionally, the MODVOC technology is compared to a commercially available audio software for polyphonic audio manipulation. Melodyne editor by Celemony which is on purchase since late 2009.

Figure 17:
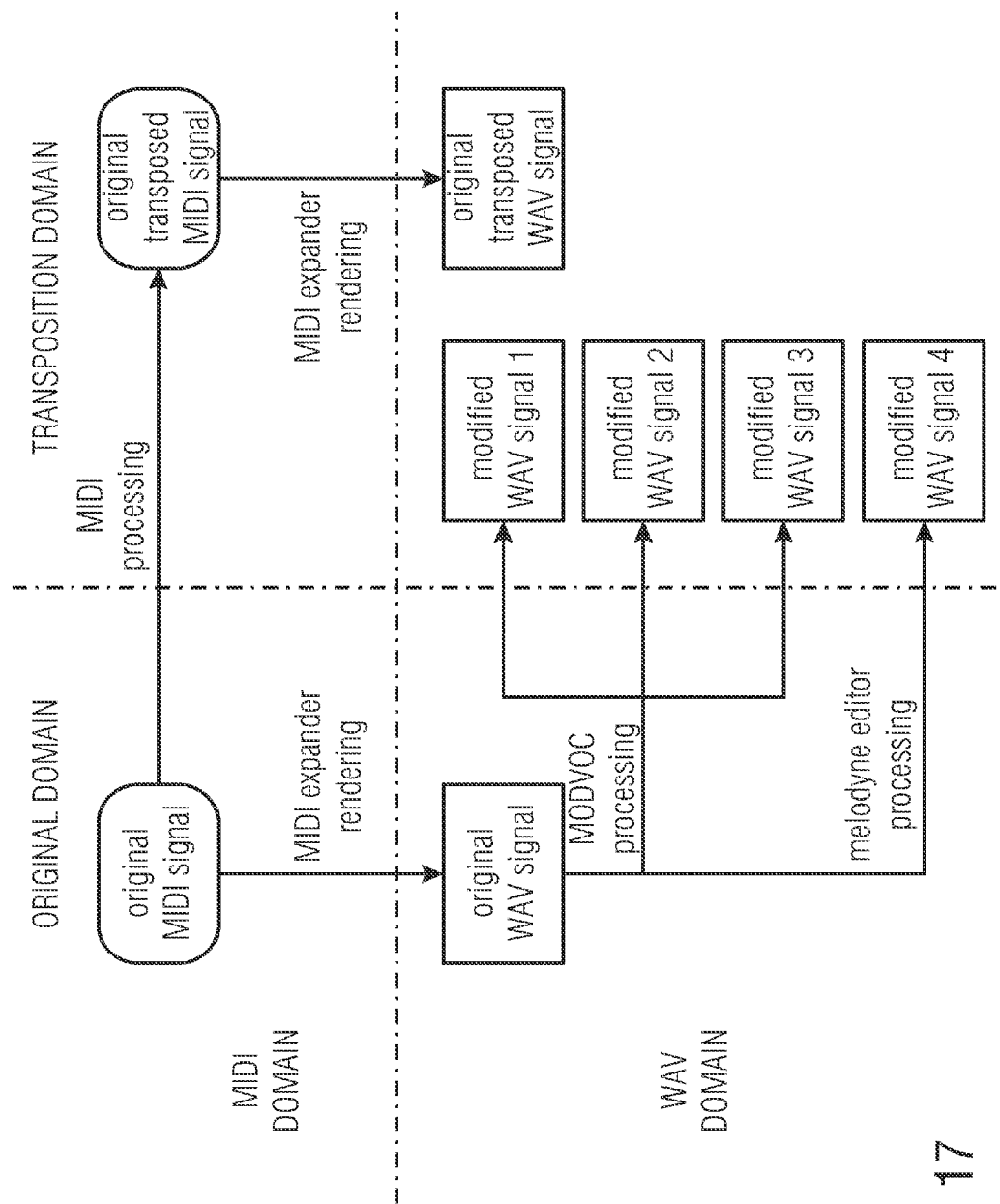
FIG. 17 is a schematic illustration of a procedure for generating the test set for evaluation of the subjective quality of modulation vocoder processing for the task of selective pitch transposition.

Since the processing under test drastically alters the audio content of a signal, a direct comparison of original and processed signal—usually an inherent part in standard listening tests—is apparently not expedient in this case. In order to nonetheless measure the subjective audio quality in a meaningful way, a special listening test procedure has been applied: the listening test set originates from symbolic MIDI data that is rendered into waveforms using a high quality MIDI expander. This approach enables a direct comparison of similarly altered audio files within the test and allows for an investigate into the effect of the selective pitch processing in isolation. The procedure of generating the test set is summarized in FIG. 17. The original test signals are prepared in symbolic MIDI data representation (upper left). A second version of these signals is generated by a symbolic MIDI processing which resembles the target processing under test on the waveform rendered original audio (upper right). Subsequently, these signal pairs are rendered by a high quality MIDI expander into waveform (WAV) files (lower left and right). In the listening test, the waveform rendered from the processed MIDI file and several modulation vocoder (MODVOC) processed version of the rendered original MIDI file are compared (lower right). Additionally, the output of the MODVOC is compared to the output of Melodyne editor.

Apart from the MODVOC processed conditions, the test includes a condition obtained by using Melodyne editor which is currently the only commercial application to address this type of audio manipulation and thus can be seen as the industry standard. Melodyne editor initially performs an automatic analysis of the entire audio file. After the initialization phase, Melodyne suggests a decomposition of the audio file. By user interaction, this decomposition can be further refined. For the sake of a fair comparison to the MODVOC processing results, the evaluation is based on the outcome of this automatic initial analysis since, apart from the a-priori knowledge of key and standard pitch, the MODVOC decomposition is fully automatic as well.

The listening test setup was based on a standard Multiple Stimuli wich Hidden Reference and Anchor (MUSHRA) test according to the ITU recommendation BS.1534 (ITU-R, "Method for the subjective assessment of intermediate sound quality (mushra)," 2001.). MUSHRA is a blind listening test. Only one Person at a time is subjected to the test. For each item, the test presents all test conditions along with the hidden reference and a hidden lowpass filtered anchor to the listener in a time-aligned fashion. Hidden reference and lower anchor are include in order to check the listeners reliability. Switching between conditions while listening is permitted and so is setting a loop on arbitrarily selected partitions of the item as is suggested in the BS.1116-1 (ITU-R, "Methods for the subjective assessment of small impairments in audio systems including multichannel sound Systems," 1994-1997.) and is applicable to MUSHRA tests as well. There is no limit of the number of repetitions the test subjects could listen to before rating the item and proceeding to the next test item, thus allowing for a very close comparison and thorough examination of the different conditions. The perceptual quality of the items is rated on a scale ranging from <<excellent>> (100 points) via <<good>> and <<fair>> up to <<poor>> (0 points). The sequence of test items is randomly ordered and moreover, the order of the conditions of each item is randomized as well.

The eight test items have been sourced from the MUTOPIA project (http://www.mutopiaproject.org/), which provides free sheet music for public use. Suitable excerpts having an approximate duration of 20 seconds at maximum have been extracted from various pieces of classical music, containing both single instruments (e.g. G, E) and dense full orchestra parts (e.g. F). Also, dominant instrumental solo melodies accompanied by other instruments (for example C) are included in the test set. Besides the short-term quasi-stationary tonal parts, also percussive elements are contained in several items (onsets of plucked guitar in C and piano in G) which pose a special challenge on the transient response of the System under test. The following table lists all items of the set.

| name | description | instruments | key mode |
|---|---|---|---|
| A | Violin Concerto, J. S. Bach, BWVI041 | Orchestra | Amin |
| B | Eine kleine Nachtmusik, W. A. Mozart, KV525 Mv1 | String Quartet | Gmaj |
| C | Berceuse, G. Fauré, Op56 | Flute and Guitar | Emaj |
| D | Nocturno, F. Strauss, Op7 | Horn and Piano | Dbmaj |
| E | Waltz, F. Carulli, Op241 No1 | Guitar | Cmaj |
| F | Ein Musikalischer Spass, W. A. Mozart, KV522 Mv1 | Horns, Violin, Viola, Cello | Fmaj |
| G | Ode an die Freude, L. V. Beethoven | Piano | Gmaj |
| H | Piano Trio, L. V. Beethoven, Op11 Mv3 | Clarinet, Cello and Piano | Bbmaj |

The MIDI processing for obtaining the original transposed signals has been done in Sonar8 manufactured by Cakewalk, The high quality waveforms rendering has been performed using Band-stand from Native Instruments in sound library version 1.0.1 R3. The MODVOC processing was evaluated in three different combinations with the two enhancement processing steps being harmonic locking and envelope shaping. For comparison to Melodyne editor, version 1.0.11 was utilized. All conditions are listed in the table below.

| condition | name | description |
|---|---|---|
| 1 | *_reference | MIDI transposed original |
| 2 | *_3k5Hz_reference | 3.5 kHz lowpass filtered original (anchor) |
| 3 | *_MODVOC | MODVOC |
| 4 | *_MODVOC_harm | MODVOC with harmonic locking |
| 5 | _MODVOC_harm_es | MODVOC with harmonic locking and envelope sharping |
| 6 | *_dna | Melodyne editor (DNA) fully automatic mode |

The subjective listening tests were conducted in an acoustically isolated listening lab that is designed to permit high-quality listening tests in an environment similar to an <<ideal>> living room. The listeners were equipped with STAX electrostatic headphones that were driven from an Edirol USB sound interface connected to an Apple MAC mini. The listening test Software was wavswitch by Fraunhofer IIS, operated in MUSHRA mode, providing a simple GUI to support the listener in performing the test. The listeners can switch between the reference (1) and the different conditions (2-7) during playout. Each listener can decide individually how long to listen to each item and condition. During the actual switching, the sound playout is muted. In the GUI, vertical Bars visualize the rating attributed to each condition. Experienced listeners were chosen that are familiar with audio coding but as well have a musical background in order to get, on the one hand, an educated judgment on typical signal processing artefacts like pre- and post-echoes or dispersion of transients and on the other hand musical parameters such as spectral pitch, melody and timbre. In addition, the listeners were asked to provide their informal observations and impressions.

Fifteen subjects in total contributed to the test result, whereas one listener had to be post-screened due to obviously failing to successfully identify the hidden original (by grading it 64 points).

Figure 18:
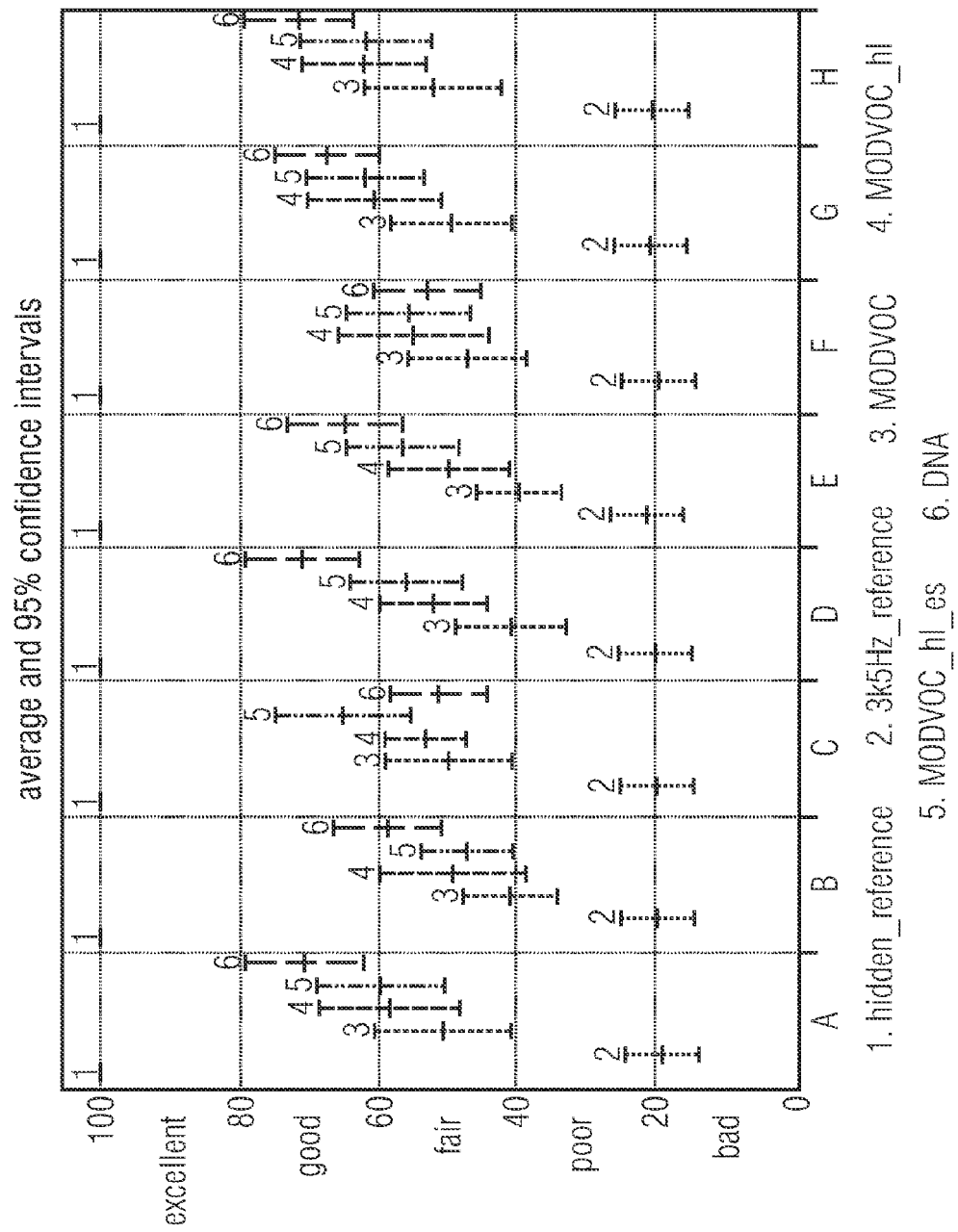
FIG. 18 is a diagram indicating an absolute MUSHRA scores and 95% confidence intervals of listening test addressing selective pitch transposition.

FIG. 18 summarizes the results of the listening test. The perceptual quality for the items processed by selective pitch transposition ranges from fair to good. The lower anchor was rated between poor and bad so that the distance from the processed items and the anchor amounts to approx. 40 MUSHRA points.

Absolute scores provide information quantifying the perceptual quality of each item (in each of the test conditions) and thereby implicitly rate the quality difference between the items in the testset, but are unsuitable to compare the different conditions within the listening test since the ratings of these conditions are not independent. For a direct comparison of the conditions originating from the different selective transposition processing schemes, score differences are considered in the following.

Figure 19:
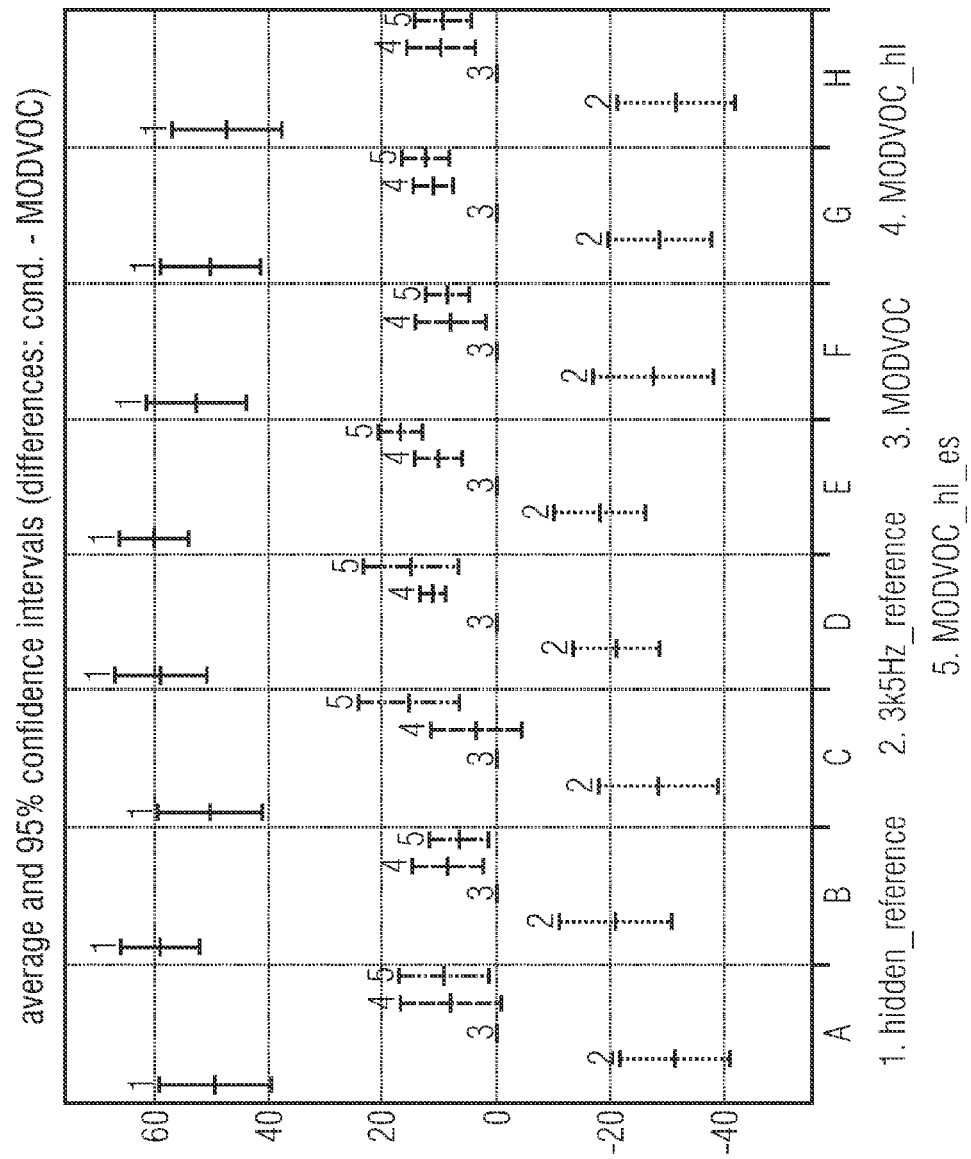
FIG. 19 is a diagram indicating a difference MUSHRA scores with respect to modulation vocoder condition and 95% confidence intervals of listening test addressing selective pitch transposition.

FIG. 19 depicts the outcome based on score differences of the enhanced MODVOC variants (conditions 4 and 5) with respect to the plain MODOVC (condition 3) results. Here, all enhanced MODVOC variants score considerably better than the plain MODVOC processing (all scores are well located above zero). There is significance in the 95% confidence sense for all items and conditions except for the application of harmonic locking only in item A and C.

Figure 20:
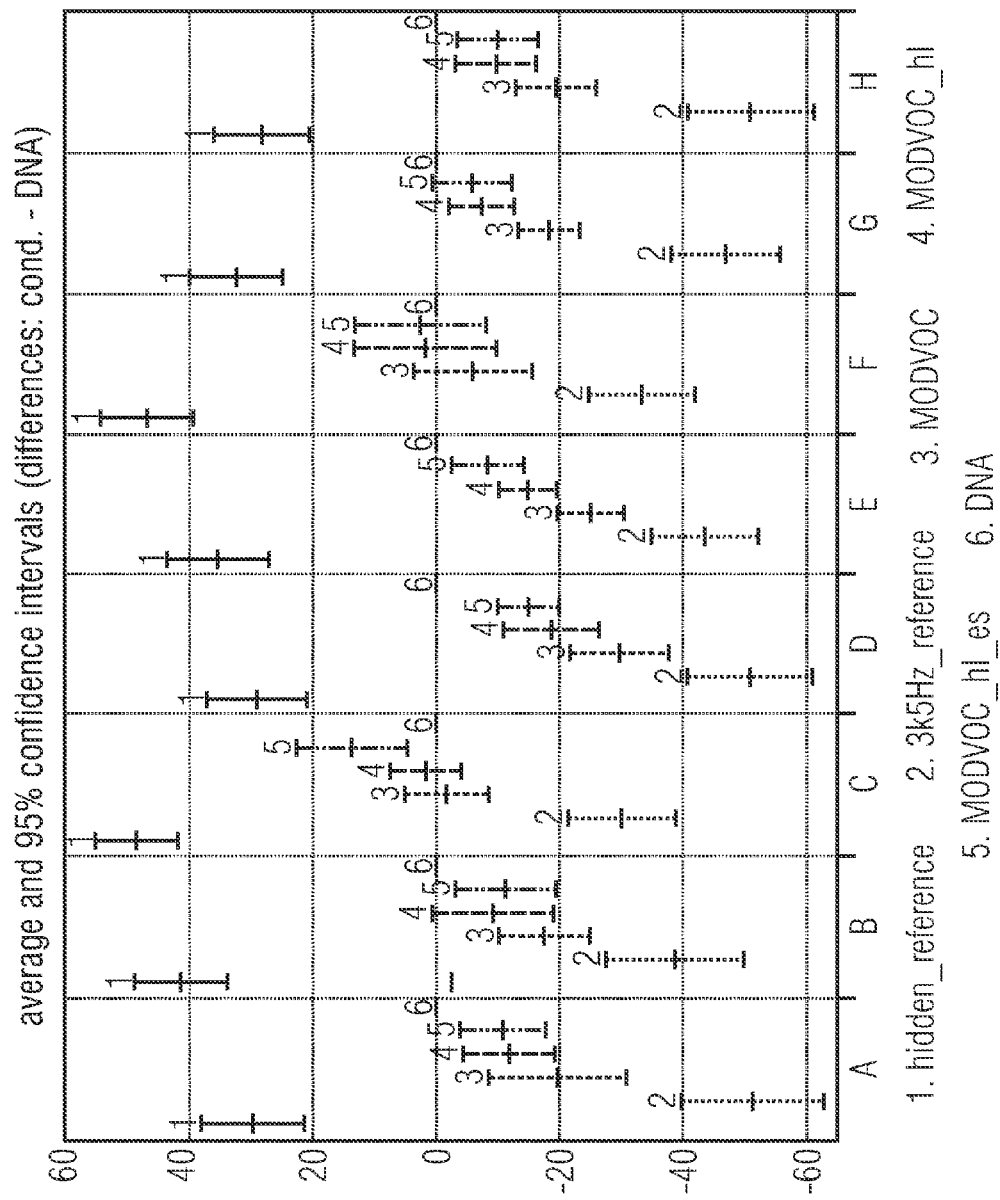
FIG. 20 is a diagram indicating a difference MUSHRA scores with respect to DNA condition and 95% confidence intervals of listening test addressing selective pitch transposition.

FIG. 20 displays the test scores as score differences with respect to condition 6 (Melodyne editor). For item C, the MODVOC in condition 5 scores significantly better than Melodyne editor while condition 4, albeit being slightly positive, and condition 3 are inconclusive in a 95% confidence interval sense (confidence intervals overlap with 0). For items B (condition 2), F, G (condition 5) also no significant conclusion can be drawn, but a tendency for better performance of the MODVOC can be seen also for item C in condition 4 and item F in conditions 4 and 5. In all other cases the MODVOC scores significantly worse than Melodyne editor.

The score reflects an overall quality judgment comprising aspects like unnatural sounding artifacts like degradation of transients by pre- or post-echos, pitch accuracy, correctness of melody and preservation of timbre. In order to interpret the results in more detail, the listeners were asked to note their informal observations alongside with noting the actual score. From these observations it can be concluded that the preservation of the timbre and absente of unnatural sounding artifacts were represented in the overall score to a higher degree than e.g. the goodness of melody preservation. Moreover, if a certain melody is unknown to the listener it seems that the test persons were not able to memorize the reference melody on short notice during the test and thus were unsure about the true melody. This can be an explanation of the higher overall rating of the Melodyne editor processed items, that have a higher fidelity with respect to preservation of timbre, especially of sounds originating from single instruments. However this comes at the prize of accidentally occurring severe melody errors that can happen presumably due to misclassification. The MODVOC is more robust in that respect since it does not predominantly rely on feature based classification techniques.

Some embodiments according to the invention relate to an enhanced modulation vocoder for selective transposition of pitch. The concept of the modulation vocoder (MODVOC) has been introduced and its general capability to perform a selective transposition on polyphonic music content has been pointed out. This renders applications possible which aim at changing the key mode of pre-recorded PCM music samples. Two enhancement techniques for selective pitch transposition by the MODVOC are proposed. The performance of the selective transposition application and the merit of these techniques are benchmarked by results obtained from a specially designed listening test methodology which is capable to govern extreme changes in terms of pitch with respect to the original audio stimuli. Results of this subjective perceptual quality assessment are presented for items that have been converted between minor and major key mode by the MODVOC and, additionally, by the first commercially available software which is also capable of handling this task.

It is worthwhile to note that while Melodyne editor initially performs an automatic analysis of the entire audio file before allowing for any manipulations the MODVOC operates on block-by block basis thus potentially allowing for real-time operation.

Enhancement techniques for the modulation vocoder (MODVOC) for selective transposition of pitch have been proposed. From the listening test results obtained for test signals rendered from MIDI it can be concluded that the perceptual quality of the plain MODVOC is indeed enhanced by harmonic locking and envelope shaping. Over all items, a increase of up to 10 MUSHRA points can be expected. A main share of the improvement stems from the harmonic locking.

Moreover, the comparison of the MODVOC which a commercially available Software (Melodyne editor) revealed that the general quality level that can be reached in selective pitch transposition, at this point of time, may be located between <<fair>> and <<good>>. The MODVOC is more robust to misinterpretation of melody since it essentially does not mainly rely on classification decisions.

As opposed to the multi-pass analysis performed by Melodyne editor on the entire audio file prior to manipulation, the MODVOC is solely based on a single-pass blockwise processing potentially allowing for streaming or realtime Operation scenarios.

Although some aspects of the described concept have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus.

The inventive encoded audio signal can be stored on a digital storage medium or can be transmitted on a transmission medium such as a wireless transmission medium or a wired transmission medium such as the Internet.

Depending on certain implementation requirements, embodiments of the invention can be implemented in hardware or in software. The implementation can be performed using a digital storage medium, for example a floppy disk, a DVD, a Blue-Ray, a CD, a ROM, a PROM, an EPROM, an EEPROM or a FLASH memory, having electronically readable control signals stored thereon, which cooperate (or are capable of cooperating) with a programmable computer system such that the respective method is performed. Therefore, the digital storage medium may be computer readable.

Some embodiments according to the invention comprise a data carrier having electronically readable control signals, which are capable of cooperating with a programmable computer system, such that one of the methods described herein is performed.

Generally, embodiments of the present invention can be implemented as a computer program product with a program code, the program code being operative for performing one of the methods when the computer program product runs on a computer. The program code may for example be stored on a machine readable carrier.

Other embodiments comprise the computer program for performing one of the methods described herein, stored on a machine readable carrier.

In other words, an embodiment of the inventive method is, therefore, a computer program having a program code for performing one of the methods described herein, when the computer program runs on a computer.

A further embodiment of the inventive methods is, therefore, a data carrier (or a digital storage medium, or a computer-readable medium) comprising, recorded thereon, the computer program for performing one of the methods described herein.

A further embodiment of the inventive method is, therefore, a data stream or a sequence of signals representing the computer program for performing one of the methods described herein. The data stream or the sequence of signals may for example be configured to be transferred via a data communication connection, for example via the Internet.

A further embodiment comprises a processing means, for example a computer, or a programmable logic device, configured to or adapted to perform one of the methods described herein.

A further embodiment comprises a computer having installed thereon the computer program for performing one of the methods described herein.

In some embodiments, a programmable logic device (for example a field programmable gate array) may be used to perform some or all of the functionalities of the methods described herein. In some embodiments, a field programmable gate array may cooperate with a microprocessor in order to perform one of the methods described herein. Generally, the methods are advantageously performed by any hardware apparatus.

While this invention has been described in terms of several embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations and equivalents as fall within the true spirit and scope of the present invention.

The invention claimed is:

1. An apparatus for modifying an audio signal, comprising:
a filterbank processor configured to generate a plurality of bandpass signals based on an audio signal;
a fundamental determiner configured to select a bandpass signal of the plurality of bandpass signals to acquire a fundamental bandpass signal;
an overtone determiner configured to identify a bandpass signal of the plurality of bandpass signals fulfilling an overtone criterion regarding the selected fundamental bandpass signal to acquire an overtone bandpass signal associated to the selected fundamental bandpass signal;
a signal processor configured to modify the selected fundamental bandpass signal based on a predefined modification target and configured to modify an identified overtone bandpass signal associated to the selected fundamental bandpass signal depending on the modification of the selected fundamental bandpass signal,
wherein the signal processor is configured to generate an amplitude modulated signal and a frequency modulated signal for each bandpass signal of the plurality of bandpass signals, wherein the signal processor is configured to modify the frequency modulated signal of the selected fundamental bandpass signal based on the predefined modification target, and wherein the signal processor is configured to modify the frequency modulated signal of the identified overtone bandpass signal associated to the selected fundamental bandpass signal depending on the modification of the selected fundamental bandpass signal; and
a combiner configured to combine the modified fundamental bandpass signal, the modified overtone bandpass signal and non selected bandpass signals of the plurality of bandpass signals to acquire a modified audio signal; wherein
at least one of the filterbank processor, fundamental determiner, the overtone determiner, the signal processor, and the combiner comprises a hardware implementation.

2. The apparatus according to claim 1, wherein each bandpass signal of the plurality of bandpass signals comprises a carrier frequency, wherein the overtone determiner is configured to compare the carrier frequency of a bandpass signal of the plurality of bandpass signals with the carrier frequency of the selected fundamental bandpass signal, wherein an overtone criterion is fulfilled, if the carrier frequency of the bandpass is a multiple of the carrier frequency of the selected fundamental bandpass signal with a predefined carrier frequency tolerance.

3. The apparatus according to claim 1, wherein the overtone determinator is configured to compare an energy content of a bandpass signal of the plurality of bandpass signals with an energy content of the selected fundamental bandpass signal, wherein an overtone criterion is fulfilled, if a ratio of the energy content of the bandpass signal and the energy content of the selected fundamental bandpass signal is within a predefined energy tolerance range.

4. The apparatus according to claim 1, wherein the overtone determinator is configured to calculate a correlation value indicating a correlation of a temporal envelope of a bandpass signal of the plurality of bandpass signals with a temporal envelope of the selected fundamental bandpass signal, wherein an overtone criterion is fulfilled, if the correlation value is higher than a predefined correlation threshold.

5. The apparatus according to claim 1, wherein the fundamental determiner is configured to select a further bandpass signal of the plurality of bandpass signals without considering all already selected fundamental bandpass signals and all already identified overtone bandpass signals to acquire a further fundamental bandpass signal.

6. The apparatus according to claim 5, wherein the overtone determiner is configured to identify a bandpass signal of the plurality of bandpass signals fulfilling an overtone criterion regarding the further selected fundamental bandpass signal without considering all already identified overtone bandpass signals to acquire an overtone bandpass signal associated to the further selected fundamental bandpass signal.

7. The apparatus according to claim 5, wherein the signal processor is configured to modify the further selected fundamental bandpass signal based on a further predefined modification target.

8. The apparatus according to claim 1, wherein the fundamental determiner is configured to select the bandpass signal based on an energy criterion.

9. The apparatus according to claim 1, wherein the fundamental determiner is configured to determine an a-weighted energy content of each bandpass signal of the plurality of bandpass signals and configured to select a bandpass signal comprising the highest a-weighted energy content to acquire the fundamental bandpass signal.

10. The apparatus according to claim 1, comprising a carrier frequency determiner, wherein the filterbank processor comprises a filterbank and a signal converter, wherein the filterbank is configured to generate bandpass signals based on the audio signal, wherein the signal converter is configured to convert the generated bandpass signals to a subband domain to acquire the plurality of bandpass signals, wherein the carrier frequency determiner is configured to determine a plurality of carrier frequencies based on the audio signal, wherein the filterbank of the filterbank processor is configured to generate the bandpass signals, so that each bandpass signal comprises a frequency range comprising a different carrier frequency of the plurality of carrier frequencies to acquire a bandpass signal associated to each carrier frequency of the plurality of carrier frequencies.

11. The apparatus according to claim 1, comprising an envelope shape determiner and an envelope shaper, wherein the envelope shape determiner is configured to determine envelope shape coefficients based on the audio signal, wherein the audio signal is a frequency domain audio signal representing a time domain input audio signal, wherein the filterbank processor is configured to generate the plurality of bandpass signals in a subband domain based on the frequency domain audio signal, wherein the combiner is configured to combine at least a subset of the plurality of bandpass signals to acquire the modified audio signal representing a time domain audio signal, wherein the envelope shaper is configured to shape an envelope of the time domain audio signal based on the envelope shape coefficients, to shape an envelope of the plurality of subband domain bandpass signals comprising the modified subband domain bandpass signal based on the envelope shape coefficients or to shape an envelope of the plurality of subband domain bandpass signals based on the envelope shape coefficients before a subband domain bandpass signal is modified by the signal processor to acquire a shaped audio signal.

12. A method for modifying an audio signal, comprising:
generating a plurality of bandpass signals based on an audio signal;
selecting a bandpass signal of the plurality of bandpass signals to acquire a fundamental bandpass signal;
identifying a bandpass signal of the plurality of bandpass signals fulfilling an overtone criterion regarding the selected fundamental bandpass signal to acquire an overtone bandpass signal associated to the selected fundamental bandpass signal;
modifying the selected fundamental bandpass signal based on a predefined modification target by generating an amplitude modulated signal and a frequency modulated signal for each bandpass signal of the plurality of bandpass signals and by modifying the frequency modulated signal of the selected fundamental bandpass signal based on the predefined modification target,
modifying an identified overtone bandpass signal associated to the selected fundamental bandpass signal depending on the modification of the selected fundamental bandpass signal by modifying the frequency modulated signal of the identified overtone bandpass signal associated to the selected fundamental bandpass signal depending on the modification of the selected fundamental bandpass signal; and
combining the modified fundamental bandpass signal, the modified overtone bandpass signal and non selected bandpass signals of the plurality of bandpass signals to acquire a modified audio signal.

13. A non-transitory computer-readable medium including a computer program with a program code for performing, when the computer program runs on a digital signal processor, a computer or a micro controller, a method for modifying an audio signal, said method comprising:
generating a plurality of bandpass signals based on an audio signal;
selecting a bandpass signal of the plurality of bandpass signals to acquire a fundamental bandpass signal;
identifying a bandpass signal of the plurality of bandpass signals fulfilling an overtone criterion regarding the selected fundamental bandpass signal to acquire an overtone bandpass signal associated to the selected fundamental bandpass signal;
modifying the selected fundamental bandpass signal based on a predefined modification target by generating an amplitude modulated signal and a frequency modulated signal for each bandpass signal of the plurality of bandpass signals and by modifying the frequency modulated signal of the selected fundamental bandpass signal based on the predefined modification target,
modifying an identified overtone bandpass signal associated to the selected fundamental bandpass signal depending on the modification of the selected fundamental bandpass signal by modifying the frequency modulated signal of the identified overtone bandpass signal associated to the selected fundamental bandpass signal depending on the modification of the selected fundamental bandpass signal; and combining the modified fundamental bandpass signal, the modified overtone bandpass signal and non selected bandpass signals of the plurality of bandpass signals to acquire a modified audio signal.

\* \* \* \* \*